(12) United States Patent
Park et al.

(10) Patent No.: US 12,532,582 B2
(45) Date of Patent: Jan. 20, 2026

(54) DISPLAY DEVICE AND METHOD OF FABRICATING DISPLAY DEVICE

(71) Applicant: Samsung Display Co., LTD., Yongin-si (KR)

(72) Inventors: Hoo Keun Park, Cheongju-si (KR); Jin Wan Kim, Hwaseong-si (KR); Sang Jo Kim, Daejeon (KR); Su Jeong Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 671 days.

(21) Appl. No.: 17/885,872

(22) Filed: Aug. 11, 2022

(65) Prior Publication Data

US 2023/0207732 A1 Jun. 29, 2023

(30) Foreign Application Priority Data

Dec. 29, 2021 (KR) .......................... 10-2021-0191013

(51) Int. Cl.
*H10H 20/831* (2025.01)
*H10H 20/01* (2025.01)
(Continued)

(52) U.S. Cl.
CPC ........ *H10H 20/8312* (2025.01); *H10H 20/01* (2025.01); *H10H 20/812* (2025.01);
(Continued)

(58) Field of Classification Search
None
See application file for complete search history.

(56) References Cited

U.S. PATENT DOCUMENTS 10,957,818 B2   3/2021   Ahmed
11,984,470 B2   5/2024   Song et al.
(Continued)

FOREIGN PATENT DOCUMENTS

JP           5374386      12/2013
KR   10-2011-0127438   11/2011
(Continued)

OTHER PUBLICATIONS

Mike Cookie, Lateral current thinking improves light and voltage in nitride LEDs, Semiconductor Today, Oct. 28, 2013, Juno Publishing and Media Solutions Ltd., Cheltenham, UK.

*Primary Examiner* — Michelle Mandala
(74) *Attorney, Agent, or Firm* — Womble Bond Dickinson (US) LLP

(57) ABSTRACT

A display device includes pixel electrodes spaced apart from one another on a substrate; light-emitting elements disposed on the pixel electrodes; a common electrode layer disposed on the light-emitting elements; and an undoped semiconductor layer disposed on the common electrode layer. The display device includes nanostructures disposed in the common electrode layer and spaced apart from one another, and the common electrode layer includes a first common electrode layer disposed between the undoped semiconductor layer and the nanostructures, and a second common electrode layer disposed between adjacent nanostructures and disposed between the light-emitting elements and the nanostructures.

15 Claims, 30 Drawing Sheets

(51) Int. Cl.
  *H10H 20/812* (2025.01)
  *H10H 20/816* (2025.01)
  *H10H 20/857* (2025.01)
  *H10H 29/14* (2025.01)

(52) U.S. Cl.
  CPC ...... *H10H 20/8162* (2025.01); *H10H 20/857* (2025.01); *H10H 29/142* (2025.01); *H10H 20/032* (2025.01); *H10H 20/0364* (2025.01)

(56) References Cited

U.S. PATENT DOCUMENTS

| | | |
|---|---|---|
| 12,107,186 B2 | 10/2024 | Choi et al. |
| 2009/0147167 A1* | 6/2009 | Park .................. G02F 1/134363 349/1 |
| 2019/0126279 A1* | 5/2019 | Gach .................. B01L 3/502792 |
| 2019/0270919 A1* | 9/2019 | Yoshiwara ................. C08J 3/24 |
| 2020/0227255 A1 | 7/2020 | Zhu et al. |
| 2023/0111615 A1* | 4/2023 | Kim .................... H10H 20/825 257/79 |
| 2023/0207607 A1* | 6/2023 | Lee .................... H10H 20/0137 257/79 |

FOREIGN PATENT DOCUMENTS

| | | |
|---|---|---|
| KR | 10-2012-0029276 | 3/2012 |
| KR | 10-2012-0122159 | 11/2012 |
| KR | 10-2013-0041642 | 4/2013 |
| KR | 10-2020-0088934 | 7/2020 |
| KR | 10-2021-0095012 A | 7/2021 |

\* cited by examiner

DISPLAY DEVICE AND METHOD OF FABRICATING DISPLAY DEVICE

CROSS-REFERENCE TO RELATED APPLICATION(S)

This application claims priority to and benefits of Korean Patent Application No. 10-2021-0191013 under 35 U.S.C. § 119 filed on Dec. 29, 2021 in the Korean Intellectual Property Office, the entire contents of which are incorporated herein by reference.

BACKGROUND

1. Technical Field

The disclosure relates to a display device.

2. Description of the Related Art

As the information-oriented society evolves, various demands for display devices are ever increasing. Display devices may be flat panel display devices such as a liquid-crystal display device, a field emission display device, and a light-emitting display device. Light-emitting display devices may include an organic light-emitting display device including organic light-emitting diodes as the light-emitting elements; an inorganic light-emitting display device including inorganic semiconductor elements as the light-emitting elements, and a micro-LED display device including light-emitting diodes as the light-emitting elements.

Recently, a head mounted display including a light-emitting display device has been developed. A head mounted display (HMD) is a glasses-type monitor device providing virtual reality (VR) or augmented reality (AR) that is worn on a user's body in the form of glasses or a helmet to form a focus close to the user's eyes. A high-resolution micro-LED display panel including micro light-emitting diodes may be applied to head mounted displays.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that can prevent defects in case that light-emitting elements in a long wavelength range are grown.

Aspects of the present disclosure also provide a method of fabricating a display device that can prevent defects in case that light-emitting elements in a long wavelength range are grown.

It should be noted that objects of the disclosure are not limited to the above-mentioned objects and other objects will be apparent to those skilled in the art from the following descriptions.

According to an embodiment, a display device may include pixel electrodes spaced apart from one another on a substrate; light-emitting elements disposed on the pixel electrodes; a common electrode layer disposed on the light-emitting elements; and an undoped semiconductor layer disposed on the common electrode layer, wherein the display device comprises nanostructures disposed in the common electrode layer and spaced apart from one another, and the common electrode layer comprises a first common electrode layer disposed between the undoped semiconductor layer and the nanostructures, and a second common electrode layer disposed between adjacent nanostructures and disposed between the light-emitting elements and the nanostructures.

Each of the light-emitting elements may include a first semiconductor layer electrically connected to the pixel electrode, a second semiconductor layer electrically connected to the common electrode layer, and an active layer disposed between the first semiconductor layer and the second semiconductor layer.

The second semiconductor layer and the common electrode layer may be integral with each other.

Each of the light-emitting elements may include an electron blocking layer disposed between the first semiconductor layer and the active layer, and a superlattice layer disposed between the active layer and the second semiconductor layer.

The device may include connection electrodes disposed between the first semiconductor layer of the light-emitting elements and the pixel electrodes.

Each of the second semiconductor layer and the common electrode layer may include doped n-type gallium nitride (n-GaN).

The nanostructures may include an inorganic insulating material.

The inorganic insulating material may include silicon oxide ($SiO_x$) or silicon nitride ($SiN_x$).

The second common electrode layer disposed between the adjacent nanostructures may directly contact the first common electrode layer.

The nanostructures may include voids.

The second common electrode layer disposed between the adjacent nanostructures may directly contact the first common electrode layer.

The second common electrode layer disposed between the light-emitting elements and the adjacent nanostructures may be spaced apart from the first common electrode layer with the nanostructures disposed between the second common electrode layer and the first common electrode layer.

The light-emitting elements may include a first light-emitting element, a second light-emitting element, and a third light-emitting element, and the first light-emitting element may include a red light-emitting element, the second light-emitting element may include a green light-emitting element, and the third light-emitting element may include a blue light-emitting element.

An arrangement density of the nanostructures on the first light-emitting element may be greater than an arrangement density of the nanostructures on the second light-emitting element and an arrangement density of the nanostructures on the third light-emitting element.

The arrangement density of the nanostructures on the second light-emitting element may be greater than the arrangement density of the nanostructures on the third light-emitting element.

According to an embodiment, a method of fabricating a display device, the method may include forming an undoped semiconductor layer on a substrate; forming a first common electrode layer comprising an n-type semiconductor on the undoped semiconductor layer; disposing a first hard mask on the first common electrode layer; forming nanostructures spaced apart from one another by etching the first hard mask; re-growing the first common electrode layer to form a second common electrode layer; disposing a second hard mask on the second common electrode layer except where light-emitting elements are to be formed; and forming light-emitting elements at locations where the light-emitting elements are to be formed.

The nanostructures and the first hard mask may include a same material in the forming of the nanostructures spaced apart from one another by etching the first hard mask.

The nanostructures may include silicon oxide ($SiO_x$) or silicon nitride ($SiN_x$).

The forming of the nanostructures spaced apart from one another by etching the first hard mask may include etching the first hard mask to form mask patterns; and forming a void recessed from a surface of the first common electrode layer in the first common electrode layer using the mask patterns, and the nanostructures may include the void.

Each of the light-emitting elements may include a first semiconductor layer electrically connected to the pixel electrode, a second semiconductor layer electrically connected to the common electrode layer, and an active layer disposed between the first semiconductor layer and the second semiconductor layer, the second semiconductor layer and the common electrode layer may be integral with each other, and the light-emitting elements may include an electron blocking layer disposed between the first semiconductor layer and the active layer, and a superlattice layer disposed between the active layer and the second semiconductor layer.

According to embodiments, it is possible to prevent defects in case that light-emitting elements in a long wavelength range are grown.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail example embodiments thereof with reference to the attached drawings, in which.

DETAILED DESCRIPTION OF THE EMBODIMENTS

Figure 1:
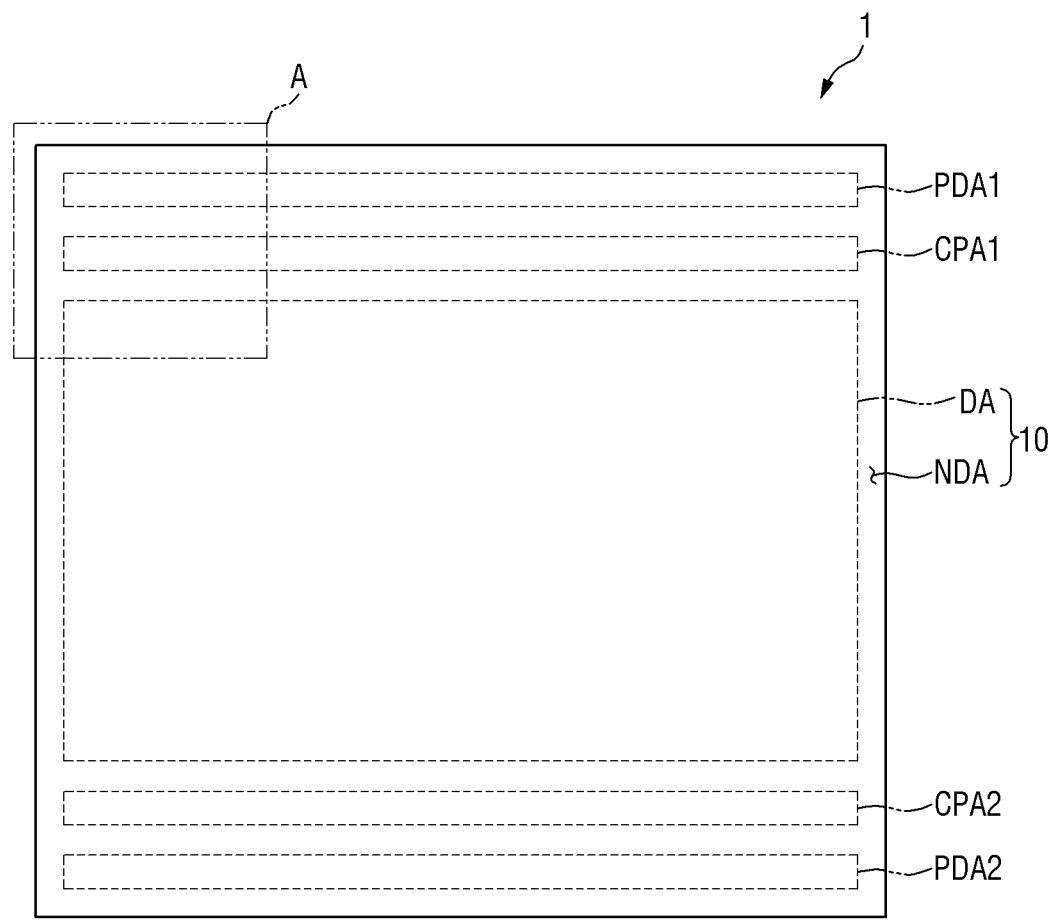
FIG. 1 is a schematic plan view of a display device according to an embodiment.
Figure 1:
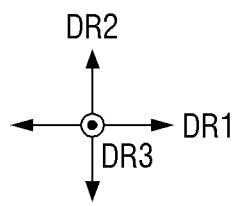

Structural and functional descriptions of embodiments disclosed herein are only for illustrative purposes. The disclosure may be embodied in many different forms without departing from the spirit and scope of the disclosure. Therefore, the embodiments are disclosed only for illustrative purposes and should not be construed as limiting the disclosure. The disclosure may also be defined by the scope of the claims.

In the drawings, sizes, thicknesses, ratios, and dimensions of the elements may be exaggerated for ease of description and for clarity. Like numbers refer to like elements throughout.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in a same way.

It will be understood that the terms "connected to" or "coupled to" may include a physical or electrical connection or coupling.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing embodiments and is not intended to be limiting.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprises," "comprising," "includes," and/or "including,", "has," "have," and/or "having," and variations thereof when used in this specification, specify the presence of stated features, regions, integers, steps, operations, elements, components, and/or groups thereof, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the orientation of the figure. Similarly, if the device in one of the figures is turned over, elements described as "below" or "beneath" other elements would then be oriented "above" the other elements. The terms "below" or "beneath" can, therefore, encompass both an orientation of above and below.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" can mean within one or more standard deviations, or within ±30%, 20%, 10% or 5% of the stated value.

Unless otherwise defined or implied herein, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein. Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, example embodiments will be described in detail with reference to the accompanying drawings.

Figure 2:
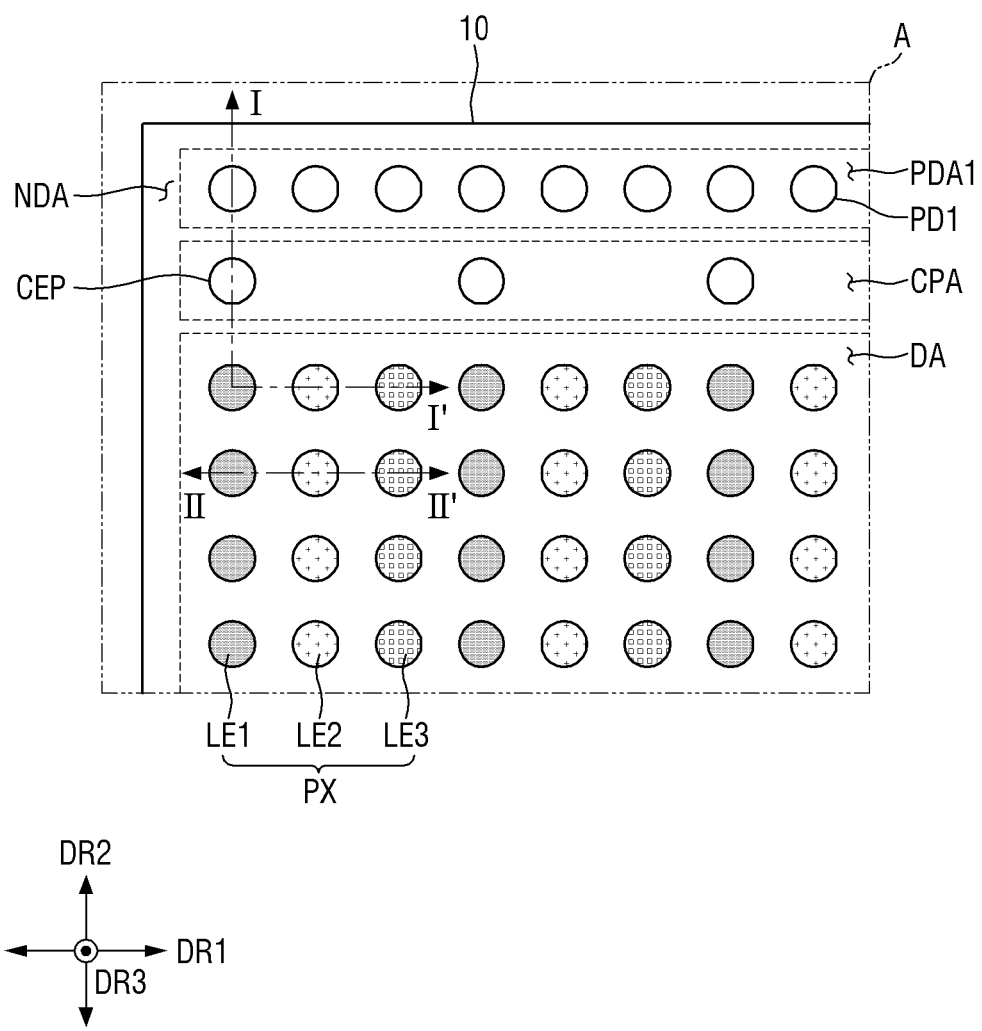
FIG. 2 is an enlarged schematic plan view showing an example of area A of FIG. 1.

FIG. 1 is a schematic plan view of a display device according to an embodiment. FIG. 2 is an enlarged schematic plan view showing an example of area A of FIG. 1.

In the example shown in FIGS. 1 to 2, a display device 1 according to an embodiment is a micro or nano light-emitting diode display device including micro or nano light-emitting diodes as light-emitting elements LE. It should be understood, however, that the disclosure is not limited thereto.

In FIGS. 1 and 2, a first direction DR1 indicates the horizontal direction of the display panel 10, a second direction DR2 indicates the vertical direction of the display panel 10, and the third direction DR3 refers to the thickness direction of the display panel 10 or the thickness direction of the semiconductor circuit board 100. As used herein, the terms "left," "right," "upper" and "lower" sides indicate relative positions in case that the display panel 10 is viewed from the top. For example, the right side refers to one side or a side in the first direction DR1, the left side refers to the other side in the first direction DR1, the upper side refers to one side or a side in the second direction DR2, and the lower side refers to the other side in the second direction DR2. The upper portion refers to the side indicated by the arrow of the third direction DR3, while the lower portion refers to the opposite side in the third direction DR3.

Referring to FIGS. 1 to 2, a display device 1 according to an embodiment may include a display panel 10 including a display area DA and a non-display area NDA.

The display panel 10 may have a rectangular shape having longer sides in the first direction DR1 and shorter sides in the second direction DR2 in case that viewed from the top. It should be understood, however, that the shape of the display panels 10 in case that viewed from the top is not limited thereto. It may have a polygonal, circular, oval, or irregular shape other than the rectangular shape in case that viewed from the top.

In the display area DA, images can be displayed. In the non-display area NDA, no image may be displayed. The non-display area NDA may surround the display area DA or may be adjacent to the display area DA. The non-display areas NDA may form the bezel of the display panel 10. Lines or circuit drivers included in the display panel 10 may be disposed in each of the non-display area NDA, or external devices may be mounted.

The display area DA of the display panel 10 may include pixels PX. Each of the pixels PX may include light-emitting elements LE. Each of the pixels PX may include one or more light-emitting elements LE to represent a color. Each of the pixel PX image light-emitting elements LE: LE1, LE2, LE3 and LE4, and may be defined as a minimum light-emitting unit representing white light.

For example, the first light-emitting element LE1 may emit light of a first color, the second light-emitting element LE2 and the fourth light-emitting element LE4 may emit light of a second color, and the third light-emitting element LE3 may emit light of a third color. For example, the first color may be red, the second color may be green, and the third color may be blue. For example, the main peak wavelength of the light of the first color may be in a range of about 600 nm to about 750 nm, the main peak wavelength of the light of the second color may be in a range of about 480 nm to about 560 nm, and the main peak wavelength of the light of the third color may be in a range of about 370 nm to about 460 nm. It should be understood, however, that the disclosure is not limited thereto. For example, the light-emitting elements LE may emit light of a same color, and one of the light-emitting elements LE may emit yellow light. The main peak wavelength of yellow light may be in a range of about 550 nm to about 600 nm. According to an embodiment, one pixel PX may include, but is not limited to, four light-emitting elements LE1, LE2, LE3 and LE4.

Each of the light-emitting elements LE may have a circular shape in case that viewed from the top. It should be understood, however, that the disclosure is not limited thereto. The light-emitting elements LE may have a polygonal shape such as a quadrangle or a pentagonal shape, an elliptical shape, or an irregular shape other than a circular shape.

The light-emitting elements LE1, LE2, LE3 and LE4 may be spaced apart from one another in the first direction DR1 and the second direction DR2. The first light-emitting element LE1 and the third light-emitting element LE3 may be arranged or disposed alternately in the first direction DR1 and the second direction DR2. The second light-emitting element LE2 and the fourth light-emitting element LE4 may be arranged alternately in the first direction DR1 and the second direction DR2.

The light-emitting elements LE1, LE2, LE3 and LE4 may be arranged alternately in diagonal directions DD1 and DD2 between the first direction DR1 and the second direction DR2. The first diagonal direction DD1 may be inclined with respect to the first direction DR1 and the second direction DR2 by 45°, and the second diagonal direction DD2 may be perpendicular to the first diagonal direction DD1.

For example, the first light-emitting element LE1 and the second light-emitting element LE2 may be arranged alternately in the first diagonal direction DD1. The third light-emitting element LE3 and the fourth light-emitting element LE4 may be arranged alternately in the first diagonal direction DD1. The first light-emitting element LE1 and the fourth light-emitting element LE4 may be arranged alternately in the second diagonal direction DD2.

The area of the first light-emitting element LE1, the area of the second light-emitting element LE2, the area of the third light-emitting element LE3 and the area of the fourth light-emitting element LE4 may be substantially all equal. It should be understood, however, that the disclosure is not limited thereto. For example, the area of the first light-emitting element LE1 may be larger than the areas of the second light-emitting element LE2 to the fourth light-emitting element LE4.

Each of the light-emitting elements LE may be electrically connected to a pixel electrode AE (see FIG. 5) of a semiconductor circuit board 100 (see FIG. 5) through a first connection electrode CNE1 (see FIG. 5), which will be described later. Each of the light-emitting elements LE may be electrically connected to a common electrode layer CEL (see FIG. 5) of a display substrate 200 (see FIG. 5).

Figure 5:
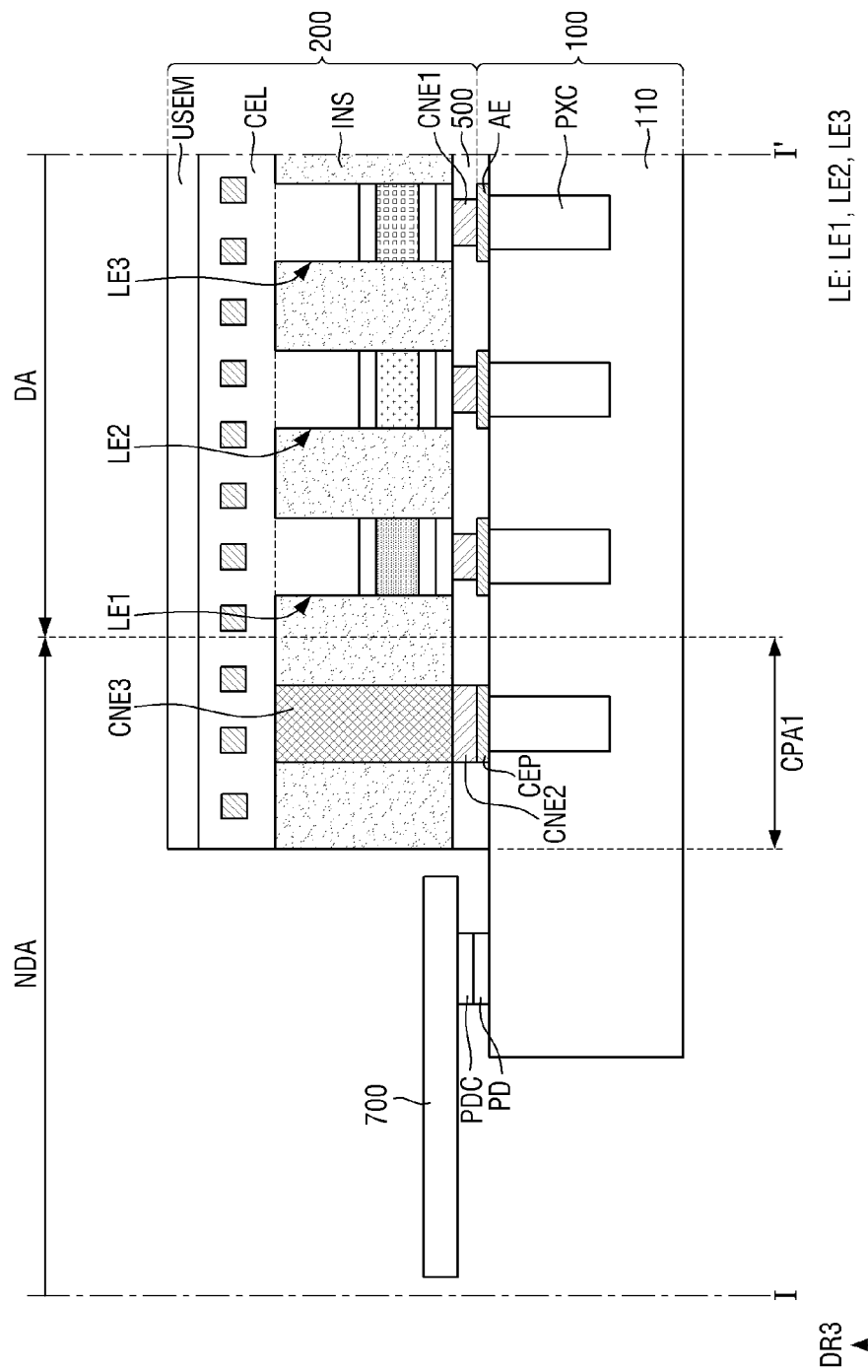
FIG. 5 is a schematic cross-sectional view taken along line I-I' of FIG. 2.

The light-emitting elements LE may be partitioned by an insulating layer INS (see FIG. 5). The light-emitting elements LE may have emission areas defined by the insulating layer INS. The insulating layer INS is disposed to surround each of the light-emitting elements LE, and may be in direct contact with the side surfaces of the light-emitting elements INS. Accordingly, the light-emitting elements LE may not be exposed to external foreign substances, for example, dust or air during the process of fabricating the display device. Since the light-emitting elements LE may be partitioned by the insulating layer INS1, it is possible to separate the light-emitting elements LE from one another even without an etching process for the light-emitting elements LE. Hereinafter, more detailed description thereon will be made with reference to the accompanying drawings.

The non-display area NDA of the display panel 10 may include a first common electrode area CPA1, a second common electrode area CPA2, or generally, a common electrode area CPA, a first pad area PDA1 and a second pad area PDA2.

The first common electrode area CPA1 may be disposed between the first pad area PDA1 and the display area DA. The second common electrode area CPA2 may be disposed between the second pad area PDA2 and the display area DA. Each of the first common electrode area CPA1 and the second common electrode area CPA2 may include common electrode connection portions CEP. The common electrode connection portions CEP may be spaced apart from each other in the first direction DR1 in the common electrode areas CPA1 and CPA2, but the disclosure is not limited thereto.

The common electrode connection portions CEP may be disposed on the semiconductor circuit board 100 to receive a common voltage from the pixel circuit PXC. As will be described later, the common electrode areas CPA1 and CPA2 may include third connection electrodes CNE3 in direct contact with the common electrode connection portions CEP. The third connection electrodes CNE3 may overlap the common electrode connection portions CEP, respectively. The third connection electrodes CNE3 may be electrically connected to the common electrode connection portions CEP, respectively, and a common electrode layer CEL.

The first pad area PDA1 may be disposed on the upper side of the display panel 10. The first pad area PDA1 may include first pads PD1 connected to a circuit board 700 (see FIG. 5). The second pad area PDA2 may be disposed on the lower side of the display panel 10. The second pad area PDA2 may include second pads to be connected to the circuit board 700. The second pad area PDA2 may be eliminated.

The first pads PD1 may be electrically connected to the circuit board 700. The first pads PD1 may be arranged such that they are spaced apart from one another in the first direction DR1 in the first pad area PDA1. The arrangement of the first pads PD1 may be designed based on the number of light-emitting elements LE disposed in the display area DA and the arrangement of lines electrically connected thereto. The arrangement of different pads may be altered in a variety of ways based on the arrangement of the light-emitting elements LE and the arrangement of the lines electrically connected to them.

Figure 3:
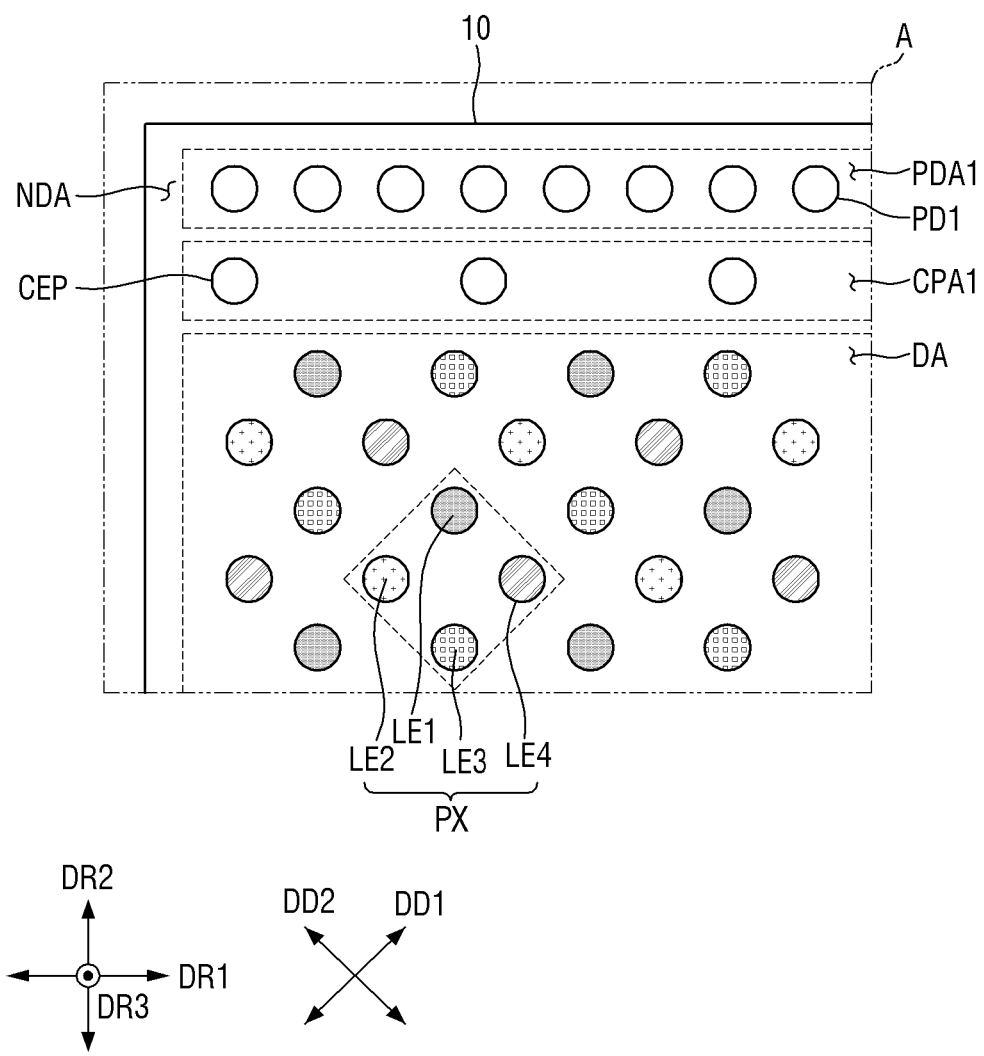
FIG. 3 is an enlarged schematic plan view showing another example of area A of FIG. 1.

FIG. 3 is an enlarged schematic plan view showing another example of area A of FIG. 1.

In FIG. 3, one pixel PX may include three light-emitting elements including a first light-emitting element LE1, a second light-emitting element LE2 and a third light-emitting element LE3. The pixels PX may be arranged in a matrix pattern similar to the light-emitting elements LE.

For example, one pixel PX may include the first light-emitting element LE1, the second light-emitting element LE2 and the third light-emitting element LE3. The first light-emitting element LE1 may emit light of a first color, the second light-emitting element LE2 may emit light of a second color, and the third light-emitting element LE3 may emit light of a third color. For example, the first color may be red, the second color may be green, and the third color may be blue. It is, however, to be understood that the disclosure is not limited thereto. The light-emitting elements LE may emit light of a same color. According to an embodiment, one pixel PX may include, but is not limited to, three light-emitting elements LE1, LE2 and LE3.

Each of the light-emitting elements LE may have a circular shape in case that viewed from the top. It should be understood, however, that the disclosure is not limited thereto. The light-emitting elements LE may have a polygonal shape such as a quadrangle or a pentagonal shape, an elliptical shape, or an irregular shape other than a circular shape.

The light-emitting elements LE1, LE2 and LE3 may be spaced apart from one another in the first direction DR1 and the second direction DR2. The first light-emitting element LE1, the second light-emitting element LE2 and the third light-emitting element LE3 are arranged alternately in the first direction DR1 and the first light-emitting elements LE1, the second light-emitting elements LE2 and the third light-emitting elements LE3 may be arranged repeatedly in the second direction DR2. The first light-emitting element LE1 the second light-emitting element LE2 and the third light-emitting element LE3 may be arranged in this order in the first direction DR1 repeatedly.

The area of the first light-emitting element LE1, the area of the second light-emitting element LE2, the area of the third light-emitting element LE3 and the area of the fourth light-emitting element LE4 may be substantially all equal. It should be understood, however, that the disclosure is not limited thereto. For example, the area of the first light-emitting element LE1 may be larger than the areas of the second light-emitting element LE2 and the third light-emitting element LE3.

Figure 4:
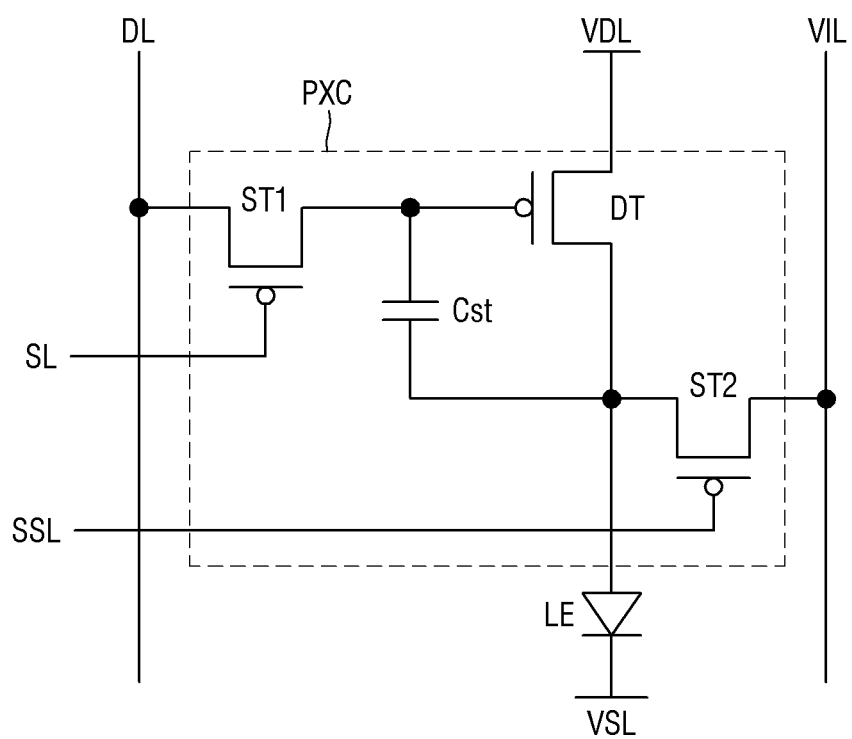
FIG. 4 is a schematic diagram of an equivalent circuit of a pixel and a light-emitting element according to an embodiment.

FIG. 4 is a schematic diagram of an equivalent circuit of a pixel and a light-emitting element according to an embodiment.

Referring to FIG. 4, each of the pixels PX may include a light-emitting element LE and a pixel circuit PXC controlling the amount of light emitted from the light-emitting element LE.

The light-emitting element LE emits light as the driving current Ids flows therein. The amount of the light emitted from the light-emitting element LE may be proportional to a driving current Ids. The light-emitting element LE may be an inorganic light-emitting element including an anode electrode, a cathode electrode, and an inorganic semiconductor disposed between the anode electrode and the cathode electrode. For example, the light-emitting element LE may be a micro light-emitting diode.

The anode electrode of the light-emitting element LE may be connected to the source electrode of the driving transistor DT, and the cathode electrode may be connected to a second supply voltage line VSL from which a low-level voltage lower than the high-level voltage is applied. In the circuit diagram of FIG. 4, the anode electrode of the light-emitting element LE is the pixel electrode AE (see FIG. 5) while the cathode electrode thereof is the common electrode connection portion CEP (see FIG. 5). The driving transistor DT adjusts an electric current flowing from the first supply voltage line VDL from which the first supply voltage is applied to the light-emitting element LE according to the voltage difference between the gate electrode and the source electrode. The gate electrode of the driving transistor DT may be connected to a first electrode of a first transistor ST1, the source electrode thereof may be connected to the anode electrode of the light-emitting element LE, and the drain electrode thereof may be connected to the first supply voltage line VDL to which a high-level voltage is applied.

The first transistor ST1 is turned on by a scan signal of a scan line SL to connect a data line DL with the gate electrode of the driving transistor DT. The gate electrode of the first transistor ST1 may be connected to the scan line SL, a first electrode thereof may be connected to the gate electrode of the driving transistor DT, and a second electrode thereof may be connected to the data line DL.

The second transistor ST2 may be turned on by a sensing signal of a sensing signal line SSL to connect an initialization voltage line VIL to the source electrode of the driving transistor DT. The gate electrode of the second transistor ST2 may be connected to the sensing signal line SSL, a first electrode thereof may be connected to the initialization voltage line VIL, and a second electrode thereof may be connected to the source electrode of the driving transistor DT.

The first electrode of each of the first and second transistors ST1 and ST2 may be a source electrode, and the second electrode thereof may be a drain electrode, but the disclosure is not limited thereto. For example, the first electrode of each of the first and second transistors ST1 and ST2 may be a drain electrode, and the second electrode thereof may be a source electrode.

The capacitor Cst may be formed between the gate electrode and the source electrode of the driving transistor DT. The capacitor Cst stores the voltage equal to the difference between the gate voltage and the source voltage of the driving transistor DT.

It should be understood, however, that the disclosure is not limited thereto. The pixel circuit PXC may have a structure that further may include transistors.

Although the driving transistor DT and the first and second transistors ST1 and ST2 are NMOS transistors in the example shown in FIG. 4, some or a number of or all of the transistors may be implemented as PMOS transistors.

Figure 6:
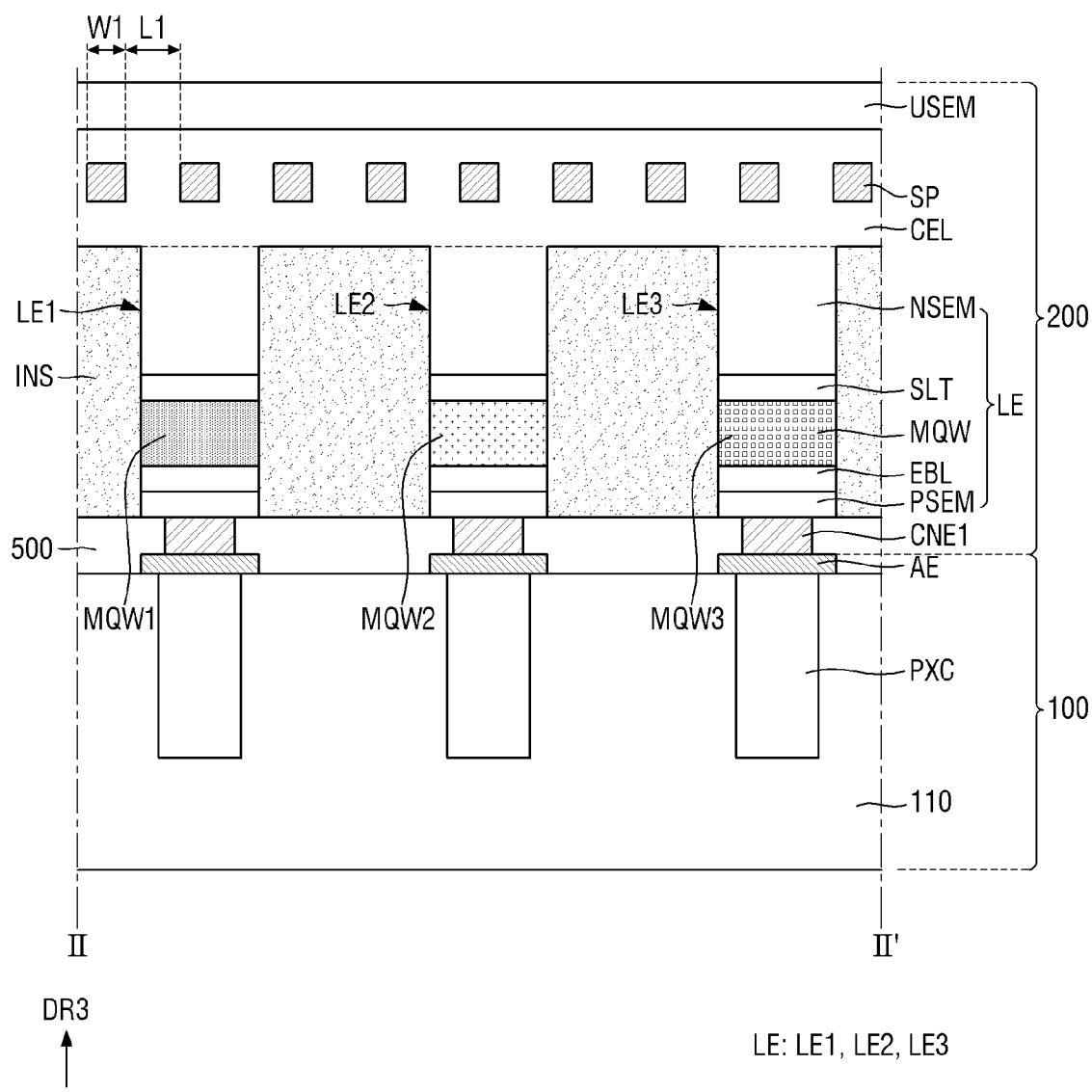
FIG. 6 is a schematic cross-sectional view taken along line II-II' of FIG. 2.

FIG. 5 is a schematic cross-sectional view taken along line I-I' of FIG. 2. FIG. 6 is a schematic cross-sectional view taken along line II-II' of FIG. 2. FIG. 5 shows a schematic cross-section traversing the light-emitting elements LE and common electrode connection portions CEP disposed in the non-display area NDA and the display area DA.

Referring to FIGS. 5 and 6, the display panel 1 according to an embodiment may include a semiconductor circuit board 100 and a display substrate 200.

The semiconductor circuit board 100 may include a first substrate 110, pixel circuits PXC, pixel electrodes AE, and common electrode connection portions CEP. The display substrate 200 may include light-emitting elements LE, an insulating layer INS, a common electrode layer CEL, and connection electrodes CNE1, CNE2 and CNE3. The display device 1 may further include a filling layer 500 disposed between the semiconductor circuit board 100 and the display substrate 200, and a circuit board 700 disposed in the non-display area NDA.

The first substrate 110 may be a silicon wafer substrate. The first substrate 110 may be made of monocrystalline silicon.

Each of the pixel circuits PXC may be disposed on the first substrate 110. Each of the pixel circuits PXC may include a complementary metal-oxide semiconductor (CMOS) circuit formed using a semiconductor process. Each of the pixel circuits PXC may include at least one transistor formed via a semiconductor process. Each of the pixel circuits PXC may further include at least one capacitor formed via a semiconductor process.

The pixel circuits PXC may be disposed in the display area DA and the non-display area NDA. Among the pixel circuits PXC, the pixel circuits PXC disposed in the display area DA may be electrically connected to the pixel electrodes AE, respectively. In other words, the pixel circuits PXC and the pixel electrodes AE may be connected in a one-to-one correspondence. Each of the pixel circuits PXC may apply an anode voltage to the pixel electrode AE.

Among the pixel circuits PXC, the pixel circuits PXC disposed in the non-display area NDA may be electrically connected to the common electrode connected to portions CEP, respectively. Each of the pixel circuits PXC may apply a cathode voltage from the second voltage line VSL (see FIG. 4) to the common electrode connection portions CEP. The pixel circuits PXC may overlap the common electrode connection portions CEP, the second connection electrodes CNE2 and the third connection electrodes CNE3 in the third direction DR3.

The pixel electrodes AE may be disposed in the display area DA, and may be disposed on the pixel circuits PXC, respectively. Each of the pixel electrodes AE may be an exposed electrode integral with the pixel circuit PXC and exposed from the pixel circuit PXC. In other words, each of the pixel electrodes AE may protrude from the upper surface of the respective pixel circuit PXC. Each of the pixel electrodes AE may receive an anode voltage from the pixel circuit PXC. The pixel electrodes AE may include a metal material such as aluminum (Al), but the type of the pixel electrodes AE is not limited.

The common electrode connection portions CEP may be disposed in the common electrode areas CPA1 and CPA2 of the non-display area NDA, and may be disposed on the pixel circuits PXC, respectively. Each of the common electrode connection portions CEP may be an exposed electrode integral with the pixel circuit PXC and exposed from the pixel circuit PXC. In other words, each of the common electrode connection portions CEP may protrude from the upper surface of the respective pixel circuit PXC. The common electrode connection portions CEP may include a metal material such as aluminum (Al), but the type of the common electrode connection portions CEP is not limited.

The common electrode connection portions CEP may electrically connect the second voltage lines VSL of the pixel circuits PXC with the third connection electrodes CNE3, the second connection electrodes CNE2 and the common electrode layer CEL of the display substrate 200. Accordingly, the voltage applied to the common electrode layer CEL through the common electrode connection portions CEP may be applied to the light-emitting elements LE.

The first pads PD1 is disposed in the first pad area PDA1 of the non-display area NDA. The first pads PD1 are spaced apart from the common electrode connection portions CEP. The first pads PD1 may be spaced apart from the common electrode connection portions CEP toward the outside of the non-display area NDA.

A pad connection electrode PDC may be disposed on the first pads PD1. The pad connection electrode PDC may be in direct contact with the upper surfaces of the first pads PD1 and may include a same material or a similar material as the third connection electrodes CNE3. In an embodiment, the pad connection electrode PDC may be connected to a circuit pad CPD1 of the circuit board 700 through a conductive connection member such as a wire. For example, the first pads PD1, the pad connection electrode PDC, the wire and the circuit pad CPD1 of the circuit board 700 may be electrically connected to one another.

Although not shown in the drawings, the semiconductor circuit board 100 and the circuit board 700 may be disposed on a lower substrate. The semiconductor circuit board 100 and the circuit board 700 may be attached to the upper surface of the lower substrate using an adhesive member such as a pressure sensitive adhesive.

The circuit board 700 may be a flexible film such as a flexible printed circuit board (FPCB), a printed circuit board (PCB), a flexible printed circuit (FPC) and a chip-on-film (COF).

The display substrate 200 may include light-emitting elements LE, an insulating layer INS defining them and a common electrode layer CEL, and may be disposed on the semiconductor circuit board 100. The light-emitting elements LE may be disposed such that they are associated with the pixel electrodes AE of the semiconductor circuit board 100, respectively.

The insulating layer INS (or a bank layer, or a pixel-defining layer) may be disposed between the pixel electrodes AE and the common electrode layer CEL of the semiconductor circuit board 100. The insulating layer INS may not overlap the pixel electrode AE but may overlap the common electrode layer CEL and may be in direct contact with the lower surface of the common electrode layer CEL. For example, the insulating layer INS is disposed to surround each of the light-emitting elements LE, and may be in direct contact with side surfaces of each of the light-emitting elements LE. The light-emitting elements LE may be disposed in the insulating layer INS.

The insulating layer INS may include an inorganic insulating material such as silicon nitride ($SiN_x$), silicon oxide ($SiO_x$), silicon oxynitride ($SiO_xN_y$), aluminum oxide ($AlO_y$) and aluminum nitride ($AlN_x$).

The light-emitting elements LE may be disposed in the openings of the insulating layer INS, respectively. Each of the light-emitting elements LE may be an inorganic light-emitting diode. The light-emitting elements LE may include semiconductor layers NSEM, PSEM, EBL and SLT and an active layer MQW. The light-emitting elements LE may be electrically connected to the pixel circuits PXC of the semiconductor circuit board 100 to emit light from the active layers MQW.

Each of the light-emitting elements LE may have a shape extended in the third direction DR3 (for example, the thickness direction of the first substrate 110). The length of the light-emitting elements LE in the third direction DR3 may be larger than the length in the horizontal direction. For example, the length of the light-emitting elements LE in the third direction DR3 may be in a range of about 1 to about 5 μm. The light-emitting elements LE may have a cylindrical shape, a disk shape, or a rod shape having the width longer than the height. It should be understood, however, that the disclosure is not limited thereto. The light-emitting element LE may have a shape of a rod, wire, tube, etc., a shape of a polygonal column such as a cube, a cuboid and a hexagonal column, or may have a shape extended in a direction with partially inclined outer surface.

According to an embodiment, each of the light-emitting elements LE may include a first semiconductor layer PSEM, an electron blocking layer EBL, an active layer MQW, a superlattice layer SLT, and a second semiconductor layer NSEM. The first semiconductor layer PSEM, the electron blocking layer EBL, the active layer MQW, the superlattice layer SLT and the second semiconductor layer NSEM may be stacked each other in this order in the third direction DR3.

The first semiconductor layer PSEM may be p-type semiconductor, and may include a semiconductor material having the following chemical formula: $Al_xGa_yIn_{1-x-y}N$ ($0 \leq x \leq 1$, $0 \leq y \leq 1$ and $0 \leq x+y \leq 1$). For example, it may be at least one of p-type doped AlGaInN, GaN, AlGaN, InGaN, AlN and InN. The first semiconductor layer PSEM may be doped with a p-type dopant, and the p-type dopant may be Mg, Zn, Ca, Ba, etc., within the spirit and the scope of the disclosure. For example, the first semiconductor layer PSEM may be p-GaN doped with p-type Mg. The first semiconductor layer PSEM may have a thickness in the range of 30 nm to 200 nm.

The electron blocking layer EBL may be disposed on the first semiconductor layer PSEM. The electron blocking layer EBL can prevent that electrons flowing into the active layer MQW fail to recombine with holes in the active layer MQW and are injected into other layers. For example, the electron blocking layer EBL may be p-AlGaN doped with p-type Mg. The thickness of the electron blocking layer may be in a range of about 10 nm to about 50 nm, but the disclosure is not limited thereto. In some example embodiments, the electron blocking layer EBL may be eliminated.

The active layer MQW may be disposed on the electron blocking layer EBL. The active layer MQW can emit light as electrons and holes are recombined therein in response to an emission signal applied through the first semiconductor layer PSEM and the second semiconductor layer NSEM. The active layer MQW may include a material having a single or multiple quantum well structure. In case that the active layer MQW may include a material having the multiple quantum well structure, well layers and barrier layers may be alternately stacked each other in the structure. The well layers may be made of InGaN, and the barrier layers may be made of GaN or AlGaN, but the disclosure is not limited thereto. For example, the active layer MQW may have a structure in which a semiconductor material having a large band gap energy and a semiconductor material having a small band gap energy may be alternately stacked each other, and may include other Group III to Group V semiconductor materials depending on the wavelength range of the emitted light.

The superlattice layer SLT is disposed on the active layer MQW. The superlattice layer SLT may relieve stress due to a difference in lattice constants between the second semiconductor layer NSEM and the active layer MQW. For example, the superlattice layer SLT may be made of InGaN or GaN. The thickness of the superlattice layer SLT may be in a range of about 50 to about 200 nm. It should be noted that the superlattice layer SLT may be eliminated.

The second semiconductor layer NSEM may be disposed on the superlattice layer SLT. The second semiconductor layer NSEM may be an n-type semiconductor. The second semiconductor layer NSEM may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN and InN. The second semiconductor layer NSEM may be doped with an n-type dopant, and the n-type dopant may be Si, Ge, Sn, etc., within the spirit and the scope of the disclosure. For example, the second semiconductor layer NSEM may be n-GaN doped with n-type Si. The thickness of the second semiconductor layer NSEM may range, but is not limited to, a range of about 500 nm to about 1 μm.

According to an embodiment, some or a number of the light-emitting elements LE of the display device 1 may include different active layers MQW to emit lights of different colors. For example, the first light-emitting element LE1 may include a first active layer MQW1 to emit red light of a first color, the second light-emitting element LE2 and the fourth light-emitting element LE4 (see FIG. 2) may include a second active layer MQW2 to emit green light of the second color, and the third light-emitting element LE3 may include a third active layer MQW3 to emit blue light of a third color. The first light-emitting element LE1, the second light-emitting element LE2, the third light-emitting element LE3 and the fourth light-emitting element LE4 may have different concentrations of dopants doped into a first semiconductor layer SEM1, an electron blocking layer EBL, an active layer MQW and a second semiconductor layer SEM2, or may have different values of x and y in the formula: $Al_xGa_yIn_{1-x-y}N$ ($0 \leq x \leq 1$, $0 \leq y \leq 1$ and $0 \leq x+y \leq 1$). The first to fourth light-emitting elements LE1, LE2, LE3 and LE4 may have substantially the same structure and material or a similar structure and material, but may include different component ratios of the semiconductor layers to emit lights of different colors.

For example, in case that the active layers MQW1, MQW2 and MQW3 contain InGaN, they may emit lights of different colors depending on the content of indium (In). For example, as the content of indium (In) increases, the wavelength range of light output from the active layers may move to the red wavelength range, and as the content of indium (In) decreases, the wavelength range of the output light may move to the blue wavelength range. Therefore, the content of indium (In) in the first active layer MQW1 may be higher than the content of indium (In) in each of the second active layer MQW2 and the third active layer MQW3. The content of indium (In) in the second active layer MQW2 may be higher than the content of indium (In) in the third active layer MQW3. For example, the content of indium (In) in the third active layer MQW3 may be about 15%, the content of indium (In) in the second active layer MQW2 may be about 25%, and the content of indium (In) in the first active layer MQW1 may be about 35% or more. For example, by adjusting the content of indium (In) in the active layers MQW, the light-emitting elements LE may emit light of different colors.

As the contents of indium (In) in the active layers MQW1, MQW2 and MQW3 increase, the lattice constant inside the active layers MQW1, MQW2 and MQW3 may be larger. As used herein, the lattice constant is a constant for defining the arrangement of atoms forming the crystal of the material (InGaN) of the active layers MQW1, MQW2 and MQW3 and repeatedly arranged with regularity in three-dimensional space. It may be expressed as the edge length (for example, x-axis length: a, y-axis length: b, z-axis length: c) of the unit cell, which is the minimum repeating unit that forms the lattice. Since the contents of indium (In) decrease in the order of the first active layer MQW1, the second active layer MQW2 and the third active layer MQW3, the lattice constant of the first active layer MQW1 may be the largest, the lattice constant of the second active layer MQW2 may be the second largest, and the lattice constant of the third active layer MQW3 may be the smallest.

As the contents of indium (In) in the active layers MQW1, MQW2 and MQW3 increase, the lattice constant inside the active layers MQW1, MQW2 and MQW3 is larger because the distance between the atoms of InGaN inside each of the active layers MQW1, MQW2 and MQW3 is larger. In the active layers MQW1, MQW2 and MQW3 grown from the common electrode layer CEL in the z-axis direction (or thickness direction), if the values of a and b of the lattice constants are significantly greater than the lattice constants a and b forming the material of the common electrode layer CEL thereunder, internal defects may occur in the active layers MQW1, MQW2 and MQW3 during the process of growing the active layers MQW1, MQW2 and MQW3. According to an embodiment, the lattice constant of each of the active layers MQW1, MQW2 and MQW3 may be greater than the lattice constant of the common electrode layer CEL. As described above, the lattice constant of the first active layer MQW1 is the largest, the lattice constant of the second active layer MQW2 is the second largest and the lattice constant of the third active layer MQW3 may be the smallest. Accordingly, internal defects may be highly likely to occur in the first active layer MQW1. Furthermore, due to internal defects generated during growth of the active layers MQW1, MQW2 and MQW3, the emission efficiency in case that driving the light-emitting devices LE1, LE2 and LE3 may be reduced.

The above-described common electrode layer CEL may be disposed on the insulating layer INS. The common electrode layer CEL may be connected to the second semiconductor layer NSEM. The common electrode layer CEL may be disposed across the entire surface of the display substrate 200, instead of being disposed in each of the light-emitting elements LE separately.

The common electrode layer CEL may be an n-type semiconductor including a same material or a similar material as the second semiconductor layer NSEM. The common electrode layer CEL may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN and InN. The common electrode layer CEL may be doped with an n-type dopant, and the n-type dopant may be Si, Ge, Sn, etc., within the spirit and the scope of the disclosure. For example, the common electrode layer CEL may be n-GaN doped with n-type Si.

Although the common electrode layer CEL may include a same material or a similar material as that of the second semiconductor layer NSEM and may be integral with it in the drawings, the disclosure is not limited thereto. In some example embodiments, the common electrode layer CEL may be disposed as a separate layer including a material different from that of the second semiconductor layer NSEM. The common electrode layer CEL may be electrically connected to the second semiconductor layer NSEM without being integrated with it.

Figure 11:
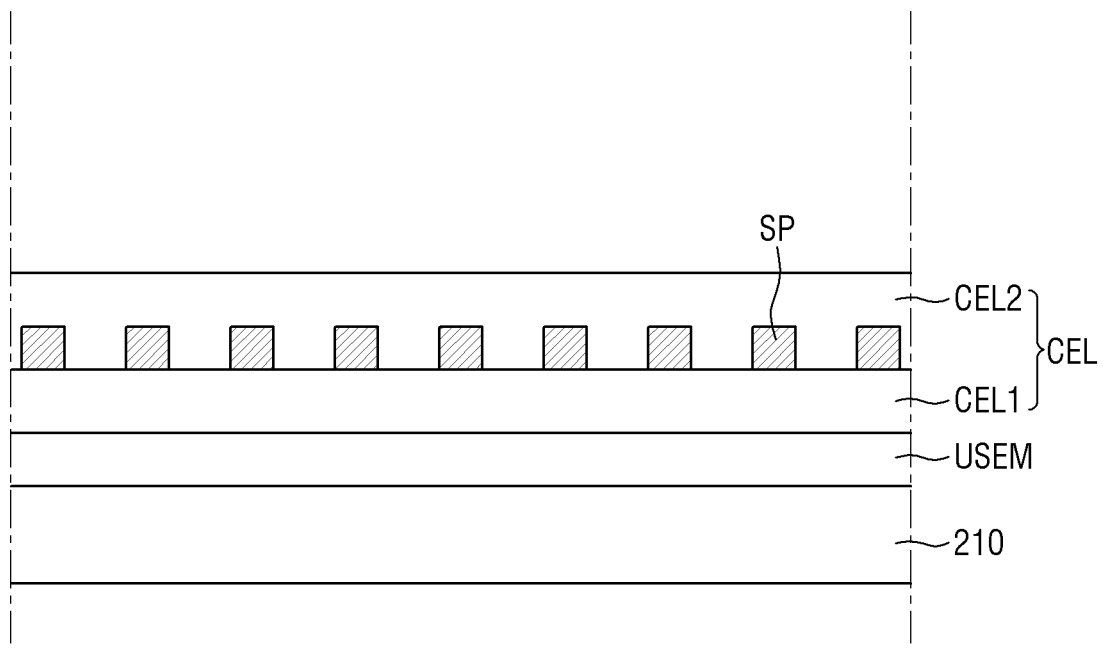

The common electrode layer CEL may include two or more layers that include a same material or a similar material but have different lattice constants. For example, as shown in FIG. 11, the common electrode layer CEL may include a first common electrode layer CEL1 on the undoped semiconductor layer USEM, and a second common electrode layer CEL2 on the first common electrode layer CEL1. The display device according to an embodiment may further include nanostructures SP that are spaced apart from one another in the common electrode layer CEL. The first common electrode layer CELL may be disposed between the undoped semiconductor layer USEM and the nanostructures SP, and the second common electrode layer CEL2 may be disposed between the adjacent nanostructures SP and the light-emitting elements LE1, LE2 and LE3 and the nanostructures SP. The second common electrode layer CEL2 between the adjacent nanostructures SP may be in direct contact with the first common electrode layer CEL1.

The nanostructures SP may include an inorganic insulating material. The inorganic insulating material may include silicon nitride ($SiN_x$), silicon oxide ($SiO_x$), silicon oxynitride ($SiO_xN_y$), aluminum oxide ($AlO_y$), aluminum nitride ($AlN_x$), etc., within the spirit and the scope of the disclosure. According to an embodiment, the inorganic insulating material may include silicon oxide ($SiO_x$) or silicon nitride ($SiN_x$).

The lattice constant of the second common electrode layer CEL2 may be greater than the lattice constant of the first common electrode layer CELL. The lattice constant of the second common electrode layer CEL2 is greater than the lattice constant of the first common electrode layer CELL because the second common electrode layer CEL2 is re-grown from the first common electrode layer CEL1 in the space between the nanostructures SP after the first common electrode layer CELL has been formed. The lattice constant of the re-grown second common electrode layer CEL2 in the space between the adjacent nanostructures SP increases due to the adjacent nanostructures SP. Accordingly, strain stress inside the re-grown second common electrode layer CEL2 can be greatly reduced.

As a result, in case that the active layers MQW1, MQW2 and MQW3 of the light-emitting elements MQW1, MQW2 and MQW3 are grown on the second common electrode layer CEL2 where the strain stress is significantly reduced, the internal defect of the active layers MQW1, MQW2 and MQW3 can be greatly reduced. Accordingly, it is possible to prevent a decrease in the emission efficiency in case that the light-emitting elements LE1, LE2 and LE3 are driven.

Each of the nanostructures SP may have a first width W1, and the distance L1 between adjacent nanostructures SP may be constant.

FIGS. 7A, 7B, 7C, and 7D are schematic plan views showing a variety of examples of nanostructures according to an embodiment.

Figure 7A:
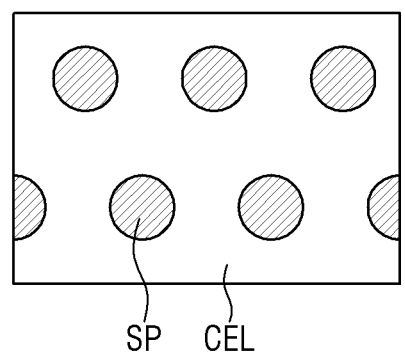
FIGS. 7A, 7B, 7C, and 7D are schematic plan views showing a variety of examples of nanostructures according to an embodiment.

As shown in FIG. 7A, the shape of the nanostructures SP may be circular in case that viewed from the top. The nanostructures SP may form a number of rows (extended along the first direction DR1 of FIG. 1). The nanostructures SP forming different rows may be arranged in a zigzag pattern with respect to one another.

Figure 7B:
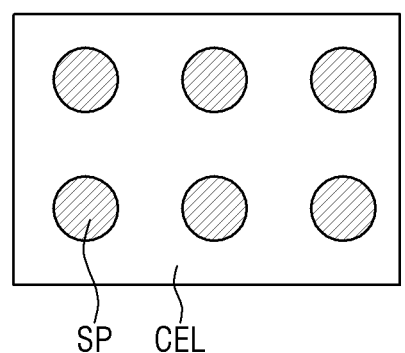

As shown in FIG. 7B, the shape of the nanostructures SP may be circular in case that viewed from the top. The nanostructures SP may form a number of rows (extended along the first direction DR1 of FIG. 1). The nanostructures SP forming different rows may be aligned and arranged along the second direction DR2 (see FIG. 1).

Figure 7C:
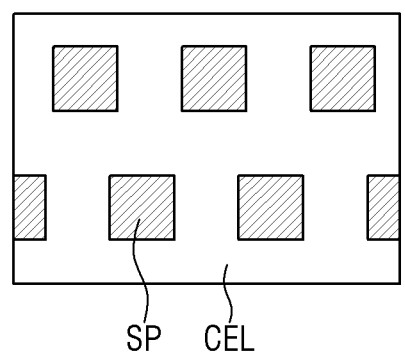

As shown in FIG. 7C, the shape of the nanostructures SP may be quadrangular in case that viewed from the top. The nanostructures SP may form a number of rows (extended along the first direction DR1 of FIG. 1). The nanostructures SP forming different rows may be arranged in a zigzag pattern with respect to one another.

Figure 7D:
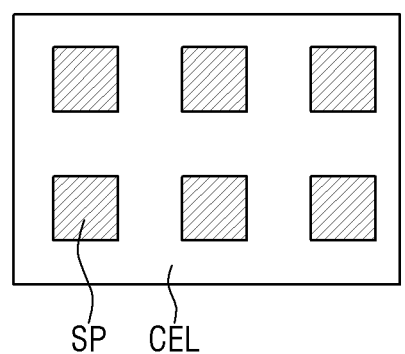

As shown in FIG. 7D, the shape of the nanostructures SP may be quadrangular in case that viewed from the top. The nanostructures SP may form a number of rows (extended along the first direction DR1 of FIG. 1). The nanostructures SP forming different rows may be aligned and arranged along the second direction DR2 (see FIG. 1).

Although the shape of the nanostructures SP is a circle or a rectangle in case that viewed from the top in the examples shown in FIGS. 7A to 7D, the disclosure is not limited thereto. The shape of the nanostructures SP may be an oval or other polygonal shapes in case that viewed from the top.

Referring back to FIGS. 5 and 6, connection electrodes CNE: CNE1, CNE2 and CNE3 may be disposed between the display substrate 200 and the semiconductor circuit board 100. The connection electrodes CNE1, CNE2 and CNE3 may include the first connection electrode CNE1 disposed between the light-emitting element LE and the pixel electrode AE, and the second connection electrode CNE2 and third connection electrode CNE3 disposed between the common electrode layer CEL and the common electrode connection portions CEP.

The first connection electrodes CNE1 may be disposed such that they are in line with the light-emitting elements LE and the pixel electrodes AE, respectively, in the display area DA. The first connection electrodes CNE1 may be disposed on one surface or a surface of the first semiconductor layer PSEM of the light-emitting elements LE.

The first connection electrodes CNE1 may be disposed on or directly disposed on the pixel electrodes AE, and may be electrically connected to the pixel electrodes AE to transmit an emission signal applied to the pixel electrodes AE to the light-emitting elements LE. The width of the first connection electrodes CNE1 may be smaller than the width of the light-emitting elements LE, but the disclosure is not limited thereto. The first connection electrodes CNE1 may work as bonding metal for bonding the pixel electrodes AE with the light-emitting elements LE during the fabricating process. The first connection electrodes CNE1 may include a material that can be electrically connected to the pixel electrodes AE and the light-emitting elements LE. For example, the first connection electrode CNE1 may include at least one of gold (Au), copper (Cu), aluminum (Al) and tin (Sn), or may include a transparent conductive oxide such as indium tin oxide (ITO) and indium zinc oxide (IZO). By way of example, the first connection electrode CNE1 may include a first layer including one of gold (Au), copper (Cu), aluminum (Al) and tin (Sn), a second layer including another one of gold (Au), copper (Cu), aluminum (Al) and tin (Sn).

The second connection electrodes CNE2 and the third connection electrodes CNE3 may be disposed in the common electrode area CPA1 in line with the common electrode connection portions CEP. The second connection electrodes CNE2 may be disposed on the common electrode connection portions CEP, and the third connection electrodes CNE3 may be disposed between the second connection electrodes CNE2 and the common electrode connection portions CEP.

The second connection electrodes CNE2 may have a shape extended in one direction or a direction and may be disposed in the openings of the insulating layer INS.

The third connection electrodes CNE3 may be disposed on or directly disposed on and in contact with the common electrode connection portions CEP. The third connection electrodes CNE3 may be electrically connected to the common electrode connection portions CEP, and may be electrically connected to one of the pads through the pixel circuits PXC disposed in the non-display area NDA.

The second connection electrodes CNE2 and the third connection electrodes CNE3 may include a material that can be electrically connected to the common electrode connection portions CEP. For example, the second connection electrodes CNE2 and the third connection electrodes CNE3 may include at least one of gold (Au), copper (Cu), aluminum (Al), and tin (Sn). By way of example, the second connection electrode CNE2 and the third connection electrode CNE3 may include a first layer including one of gold (Au), copper (Cu), aluminum (Al) and tin (Sn), a second layer including another one of gold (Au), copper (Cu), aluminum (Al) and tin (Sn).

The filling layer 500 may be disposed between the semiconductor circuit board 100 and the display substrate 200. The filling layer 500 may be used to fill the space between the first substrate 110 and the common electrode layer CEL formed by level differences between the pixel electrodes AE and the common electrode connection portions CEP of the semiconductor circuit board 100 and the light-emitting elements LE of the display substrate 200. For example, the filling layer 500 may be used to fill the space formed between the pixel electrodes AE adjacent to each other in the horizontal direction, between the first connection electrodes CNE1 adjacent to each other in the horizontal direction, and between the common electrode connection portions CEP. The filling layer 500 may be filled with air or may be in a vacuum. The filling layer 500 may insulate the exposed electrodes. The filling layer 500 may include, but is not limited to, an inorganic insulating material such as silicon oxide ($SiO_x$), silicon nitride ($SiN_x$) and silicon oxynitride ($SiO_xN_y$), or an organic insulating material.

Hereinafter, processing steps of fabricating the display device 1 will be described with reference to other drawings.

Figure 8:
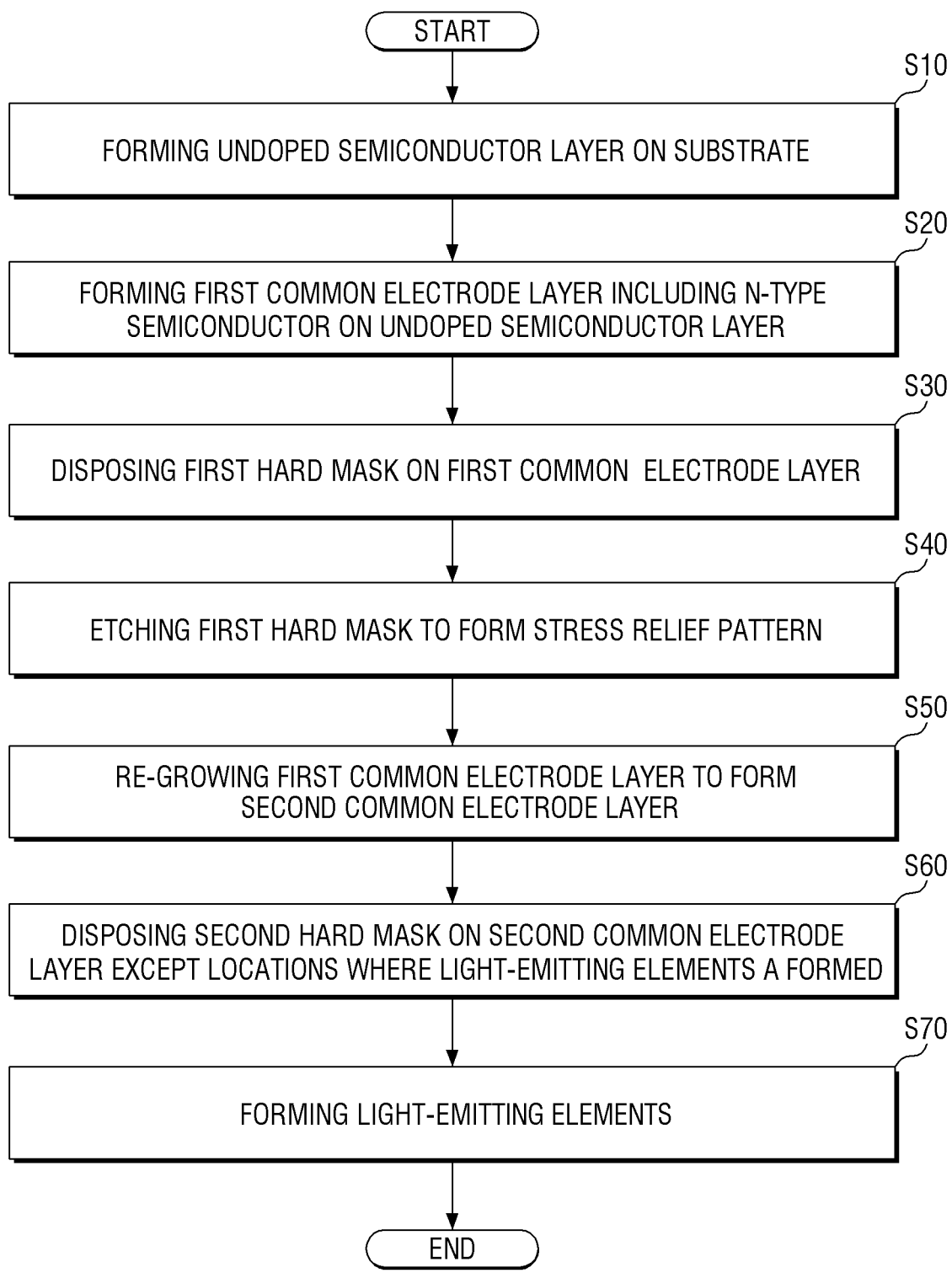
FIG. 8 is a flowchart for illustrating a method of fabricating a display device according to an embodiment.

FIG. 8 is a flowchart for illustrating a method of fabricating a display device according to an embodiment. FIGS. 9 to 17 are schematic cross-sectional views showing processing steps of a method of fabricating a display device according to an embodiment.

Referring to FIG. 8, a method of fabricating a display device 1 may include: forming an undoped semiconductor layer on the second substrate 210 (step S10); forming a first common electrode layer comprising an n-type semiconductor on the undoped semiconductor layer (step S20); disposing a first hard mask on the first common electrode layer (step S30); forming a stress relief pattern by etching the first hard mask (step S40); forming a second common electrode layer by re-growing the first common electrode layer (step S50); disposing a second hard mask on the second common electrode layer except for locations where light-emitting elements are to be formed (step S60); and forming the light-emitting elements (step S70).

The method of fabricating a display device 1 may include preparing a semiconductor circuit board 100 (see FIG. 6) and a display substrate 200 (see FIG. 6) individually, and attaching them together. In the process of fabricating the display substrate 200, a process of preparing a base substrate SUB including an undoped semiconductor layer and a common electrode layer CEL and forming light-emitting elements LE thereon may be performed. The light-emitting elements LE may include active layers MQW1, MQW2 and MQW3 having different materials, and may be formed with layers of different materials depending on their positions. Hereinafter, the processing steps of a method of fabricating a display device will be described with reference to the flowchart of FIG. 8 in conjunction with the schematic cross-sectional views of FIGS. 9 to 17.

Figure 9:
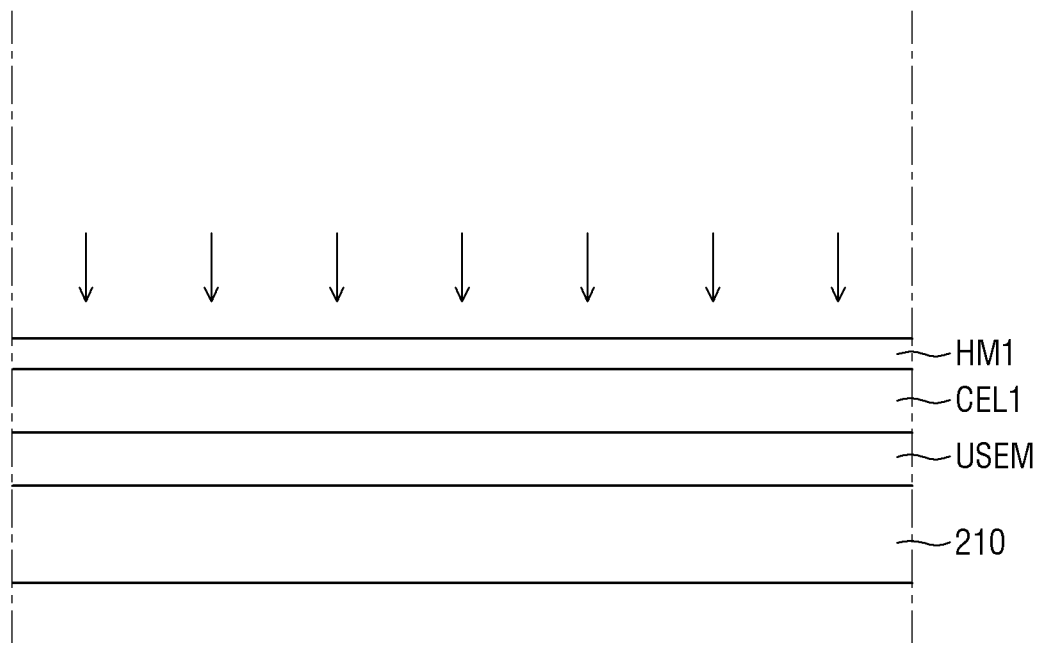
FIGS. 9 to 17 are schematic cross-sectional views showing processing steps of a method of fabricating a display device according to an embodiment.

Initially, referring to FIGS. 8 and 9, an undoped semiconductor layer USEM is formed on the second substrate 210 (step S10), a first common electrode layer CEL1 is formed on the undoped semiconductor layer USEM (step S20), and a first hard mask HM1 is disposed on the first common electrode layer CEL1 (step S30).

The base substrate may include the second substrate 210, the undoped semiconductor layer USEM disposed on the second substrate 210, and the first common electrode layer CEL1 on the undoped semiconductor layer USEM. The second substrate 210 may be a sapphire substrate ($Al_2O_3$) or a silicon wafer including silicon. The second substrate 210 may be, but is not limited to, a semiconductor substrate such as a GaAs substrate. In the following description, an example where the second substrate 210 is a sapphire substrate will be described.

The undoped semiconductor layer USEM and the first common electrode layer CEL1 disposed on the second substrate 210 are identical to those described above. The first common electrode layer CEL1 may be an n-type semiconductor, the undoped semiconductor layer USEM may include an undoped semiconductor, and may be a material that is not doped into n-type or p-type. According to an embodiment, for example, the first common electrode layer CEL1 may be one or more of n-type doped AlGaInN, GaN, AlGaN, InGaN, AlN and InN. The undoped semiconductor layer USEM may be, but is not limited to, at least one of undoped InAlGaN, GaN, AlGaN, InGaN, AlN, and InN.

The undoped semiconductor layer USEM and the first common electrode layer CEL1 may be formed by epitaxial growth, as well as the second common electrode layer CEL2 to be described later. The epitaxial growth may be carried out by electron beam deposition, physical vapor deposition (PVD), chemical vapor deposition (CVD), plasma laser deposition (PLD), dual-type thermal evaporation, sputtering, metal-organic chemical vapor deposition (MOCVD), etc., within the spirit and the scope of the disclosure. For example, it may be carried out by, but is not limited to, metal-organic chemical vapor deposition (MOCVD).

A precursor material for forming the semiconductor material layers is not particularly limited and any material may be selected as long as it can form a target material. For example, the precursor material may be a metal precursor including an alkyl group such as a methyl group or an ethyl group. For example, it may be, but is not limited to, a compound such as trimethyl gallium ($Ga(CH_3)_3$), trimethyl aluminum ($Al(CH_3)_3$), or triethyl phosphate ($(C_2H_5)_3PO_4$).

Figure 10:
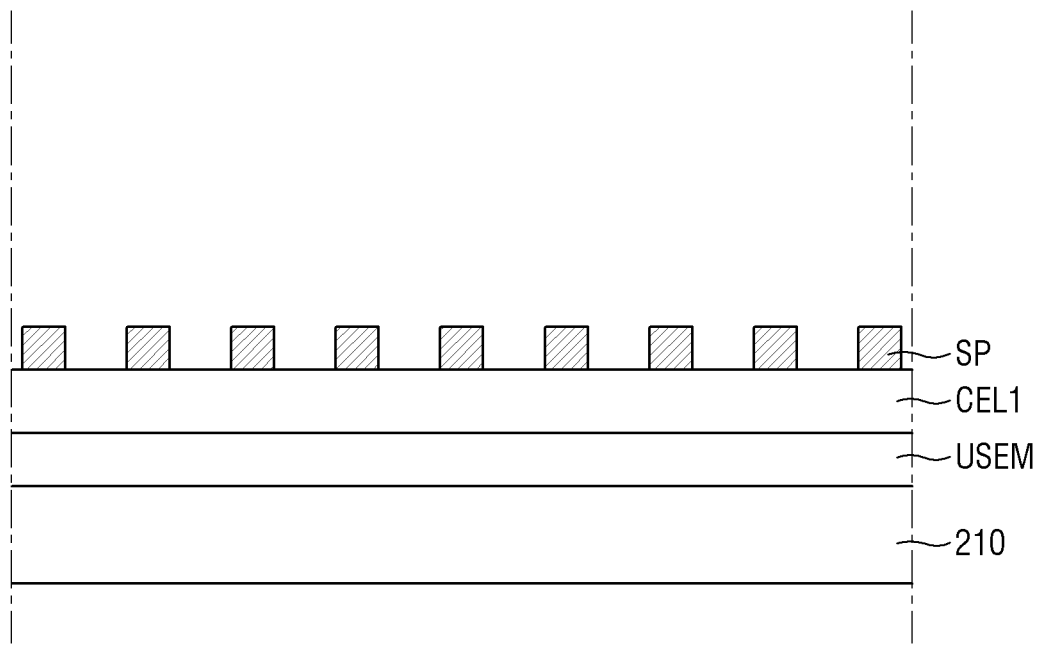

Subsequently, referring to FIGS. 8 and 10, the first hard mask HM1 is etched to form a stress relief pattern SP (step S40). The stress relief pattern SP may include nanostructures or nano rods. The etching of the first hard mask HM1 may include dry etching or wet etching. The first hard mask HM1 may include an inorganic insulating material. The inorganic insulating material may include silicon nitride ($SiN_x$), silicon oxide ($SiO_x$), silicon oxynitride ($SiO_xN_y$), aluminum oxide ($AlO_y$), aluminum nitride ($AlN_x$), etc., within the spirit and the scope of the disclosure. According to an embodiment, the inorganic insulating material may include silicon oxide ($SiO_x$) or silicon nitride ($SiN_x$).

Subsequently, referring to FIGS. 8 and 11, the first common electrode layer CEL1 is re-grown to form a second common electrode layer CEL2 (step S50). By way of example, the second common electrode layer CEL2 may be formed between adjacent stress relief patterns SP and between the light-emitting elements LE1, LE2 LE3 and the stress relief patterns SP. The second common electrode layer CEL2 between the adjacent stress relief patterns SP may be in direct contact with the first common electrode layer CEL1.

The lattice constant of the second common electrode layer CEL2 may be greater than the lattice constant of the first common electrode layer CEL1. The lattice constant of the second common electrode layer CEL2 is greater than the lattice constant of the first common electrode layer CEL1 because the second common electrode layer CEL2 is re-grown from the first common electrode layer CEL1 in the space between the stress relief patterns SP after the first common electrode layer CEL1 has been formed. The lattice constant of the re-grown second common electrode layer CEL2 in the space between the adjacent stress relief patterns SP increases due to the adjacent stress relief patterns SP. As a result, strain stress inside the re-grown second common electrode layer CEL2 can be greatly reduced.

As a result, in case that the active layers MQW1, MQW2 and MQW3 of the light-emitting elements MQW1, MQW2 and MQW3 are grown on the second common electrode layer CEL2 where the strain stress is significantly reduced, the internal defect of the active layers MQW1, MQW2 and MQW3 can be greatly reduced. Accordingly, it is possible to prevent a decrease in the emission efficiency in case that the light-emitting elements LE1, LE2 and LE3 are driven.

Figure 12:
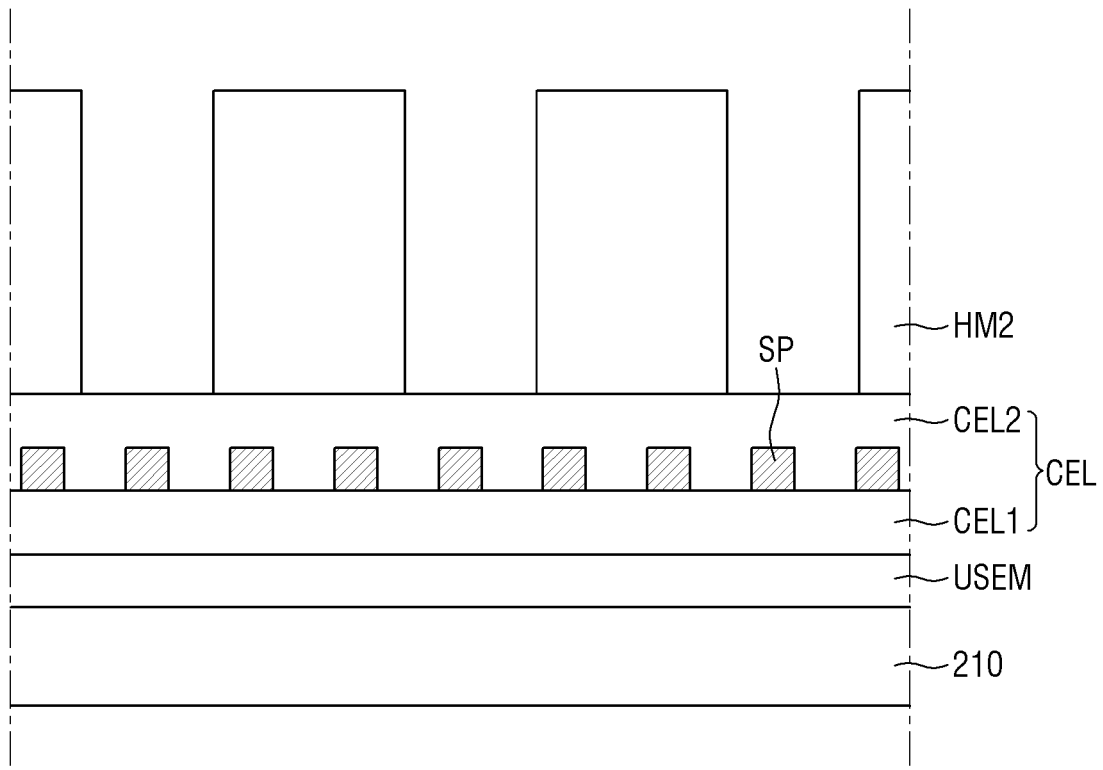

Subsequently, referring to FIGS. 8 and 12, a second hard mask HM2 is disposed on the second common electrode layer CEL2 (step S60).

The material of the second hard mask HM2 may be identical to that of the above-described first hard mask HM1, but the disclosure is not limited thereto.

The second hard mask HM2 may be disposed except locations where light-emitting elements LE1, LE2 and LE3 to be described later are to be formed.

Figure 13:
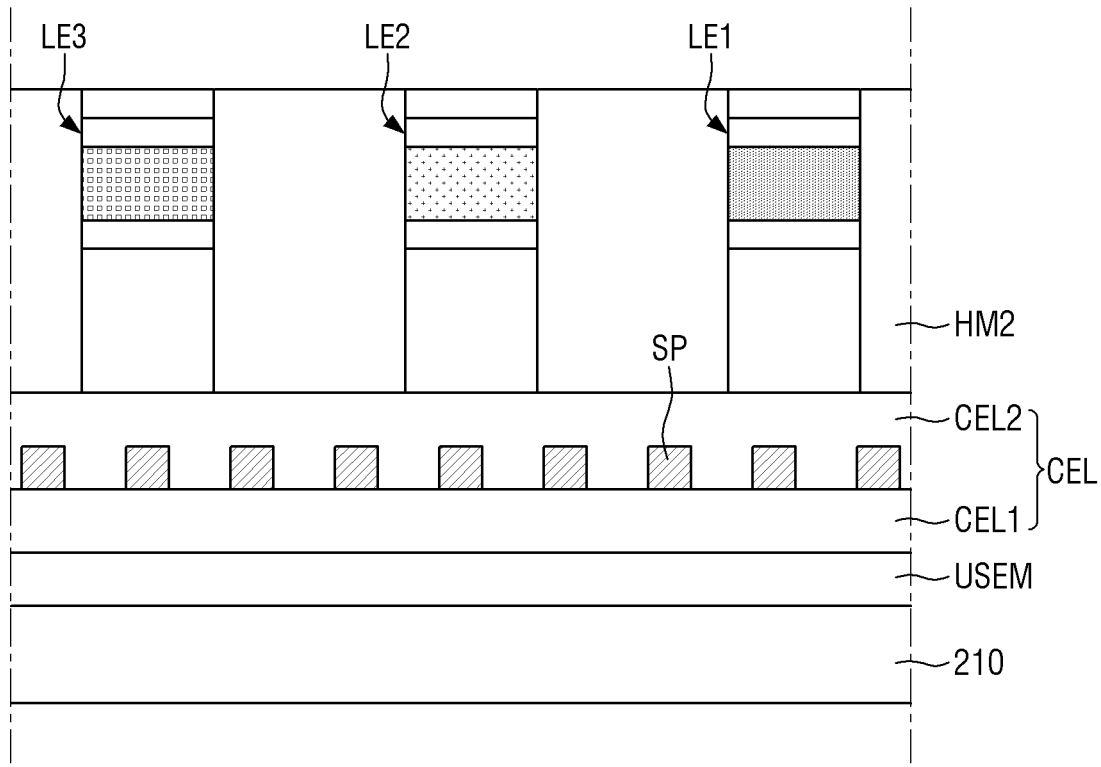

Subsequently, referring to FIGS. 8 and 13, the light-emitting elements LE1, LE2 and LE3 are formed (step S70).

Figure 14:
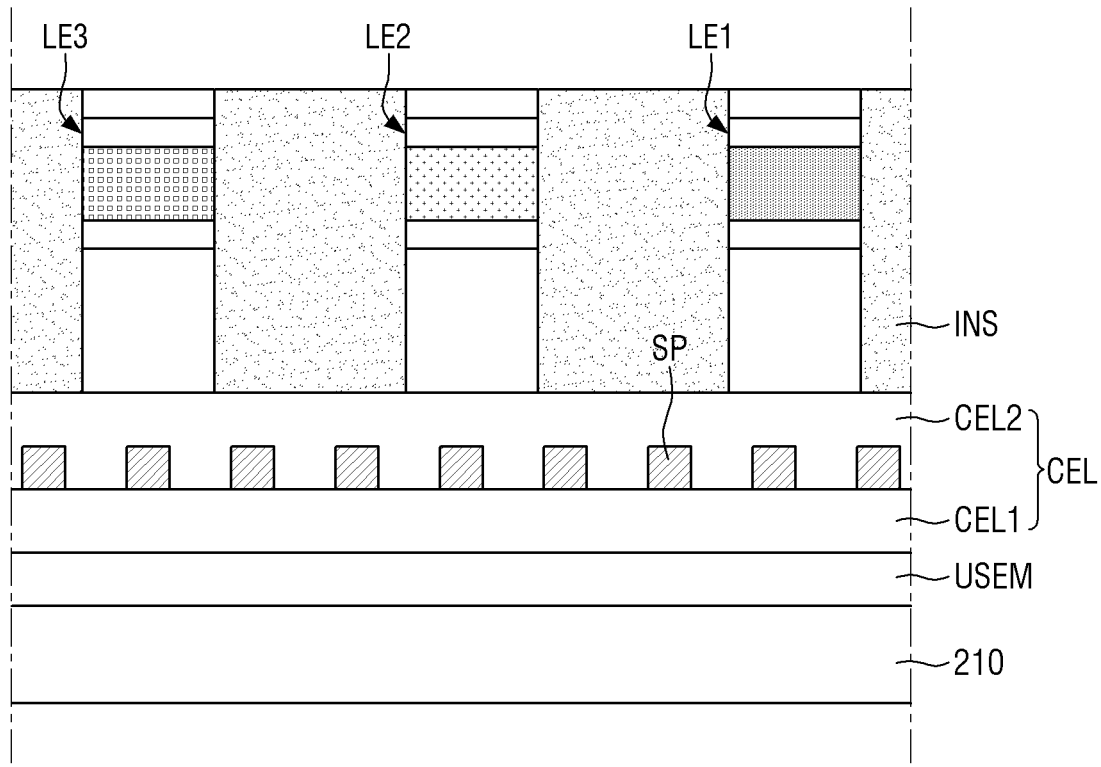

Subsequently, referring to FIG. 14, the second hard mask HM2 is removed, and an insulating layer INS is formed between adjacent ones of the light-emitting elements LE1, LE2 and LE3.

Figure 15:
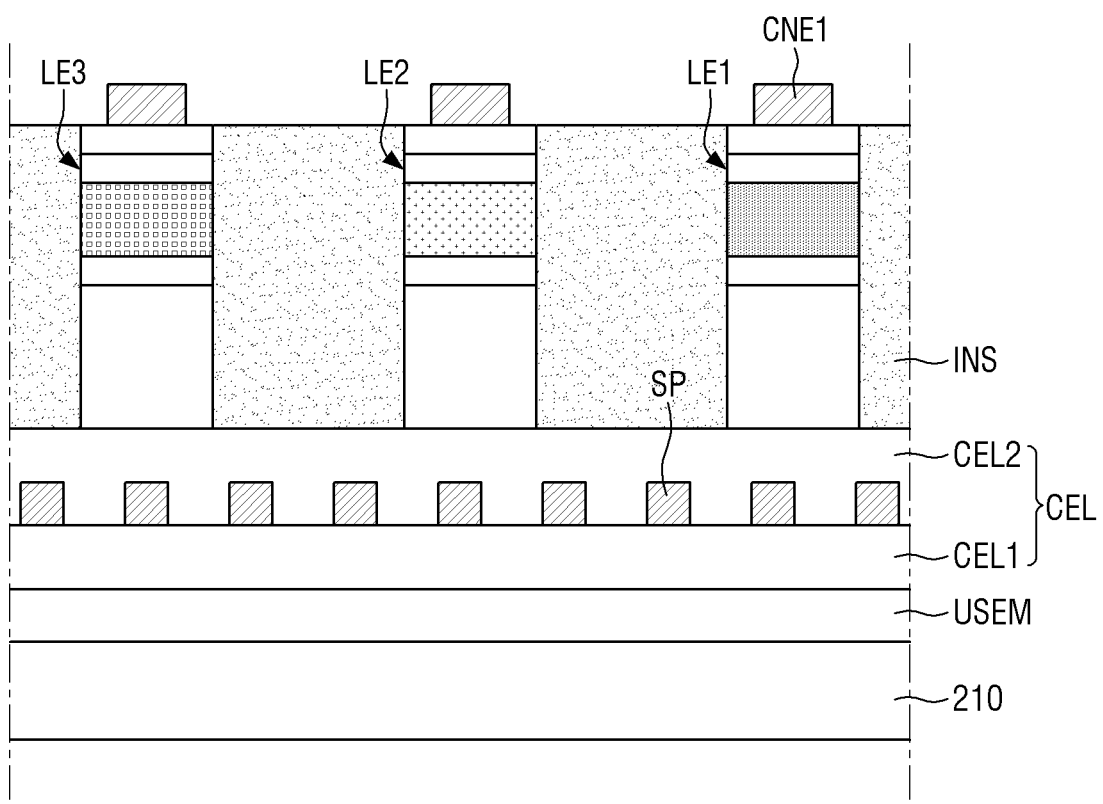

Subsequently, as shown in FIG. 15, first connection electrodes CNE1 are formed on the light-emitting elements LE. The first connection electrodes CNE1 may be formed on the light-emitting elements LE1, LE2 and LE3 via a photo process.

In this manner, a display substrate 200 disposed on the second substrate 210 may be produced. Subsequently, the semiconductor circuit board 100 and the display substrate 200 may be attached together so that the display device 1 may be fabricated.

Figure 16:
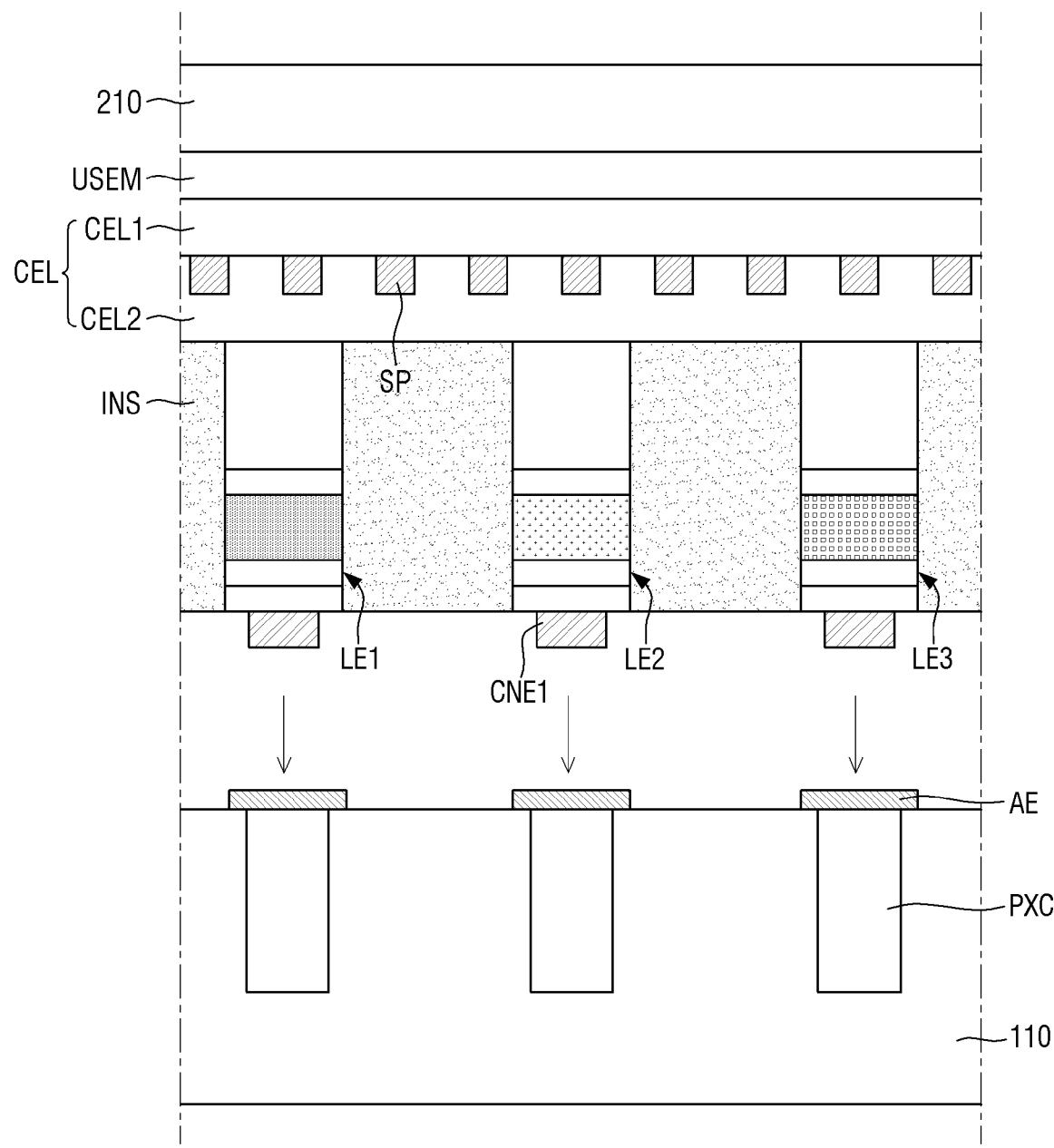

Subsequently, as shown in FIGS. 6 and 16, the display substrate 200 on which the light-emitting elements LE are formed and the semiconductor circuit board 100 are disposed and attached together.

The semiconductor circuit board 100 may include a first substrate 110 including pixel circuits PXC, and pixel electrodes AE formed on one surface or a surface of the first substrate 110. The second substrate 210 and the display substrate 200 may be aligned so that the light-emitting elements LE are in line with the pixel electrodes AE of the semiconductor circuit substrate 100 on the semiconductor circuit substrate 100. The first connection electrodes CNE1 and the pixel electrodes AE may be aligned such that they overlap each other in the thickness direction.

In case that the second substrate 210 and the display substrate 200 are aligned with the semiconductor circuit board 100, a filling layer 500 is disposed between them, and the display substrate 200 and the semiconductor circuit board 100 are attached together. For example, in case that the display substrate 200 and the semiconductor circuit board 100 are aligned with each other and the first connection electrodes CNE1 come into contact with the pixel electrodes AE, the material of the filling layer 500 may be implanted to fill the space between the display substrate 200 and the semiconductor circuit board 100. Thereafter, in case that the injected material of the filling layer 500 is cured, the display substrate 200 and the semiconductor circuit board 100 may be attached together. It is, however, to be understood that the disclosure is not limited thereto.

The first connection electrodes CNE1 disposed on the light-emitting elements LE of the display substrate 200 may be in direct contact with the pixel electrodes AE. In case that the semiconductor circuit board 100 and the display substrate 200 are attached together, the both ends of the light-emitting elements LE may be electrically connected to the pixel circuits PXC of the semiconductor circuit board 100.

Figure 17:
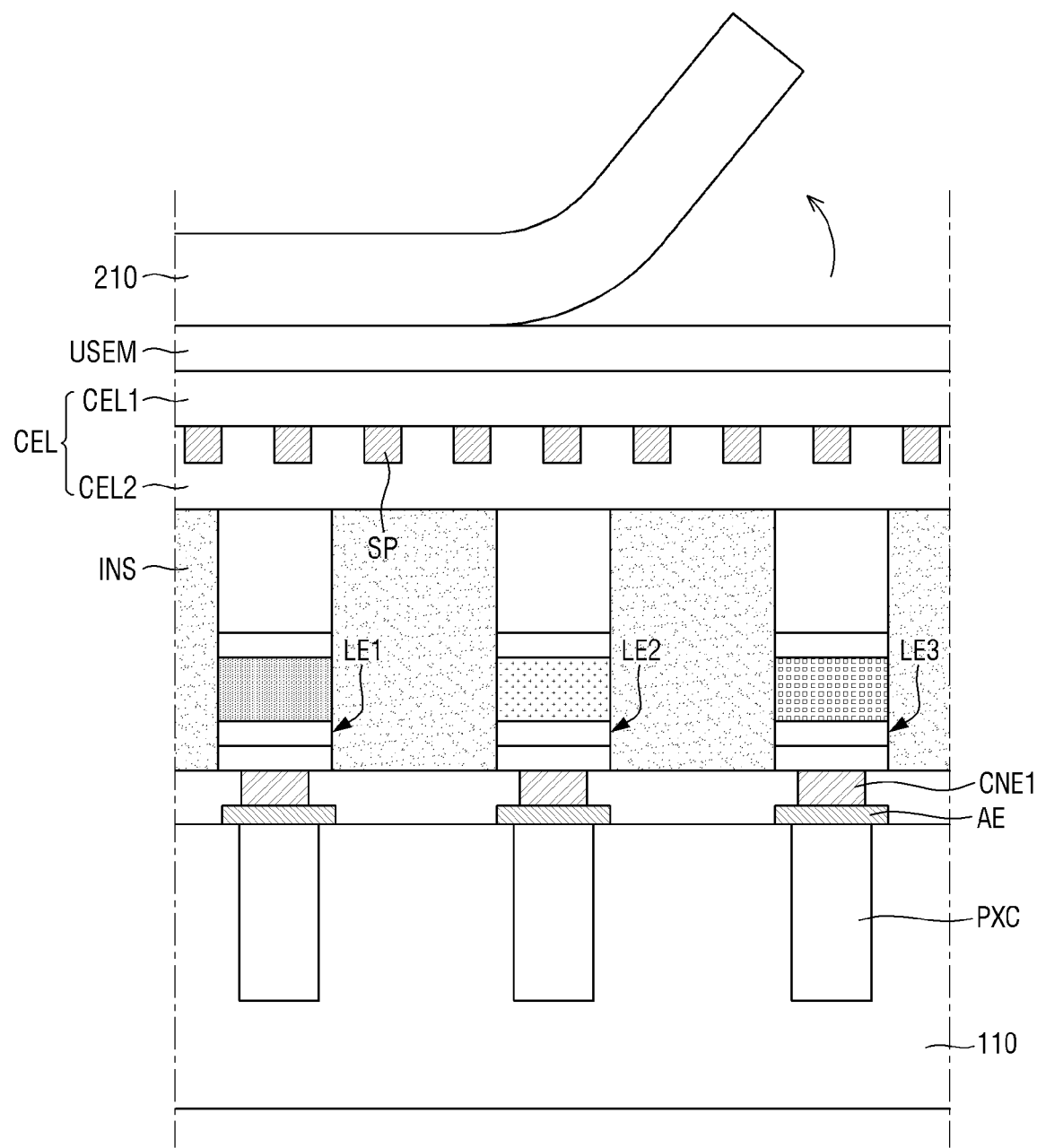

Subsequently, as shown in FIG. 17, the second substrate 210 disposed on the undoped semiconductor layer USEM of the display substrate 200 is removed, so that the display device 1 can be produced.

Hereinafter, display devices according to other example embodiments will be described.

Figure 18:
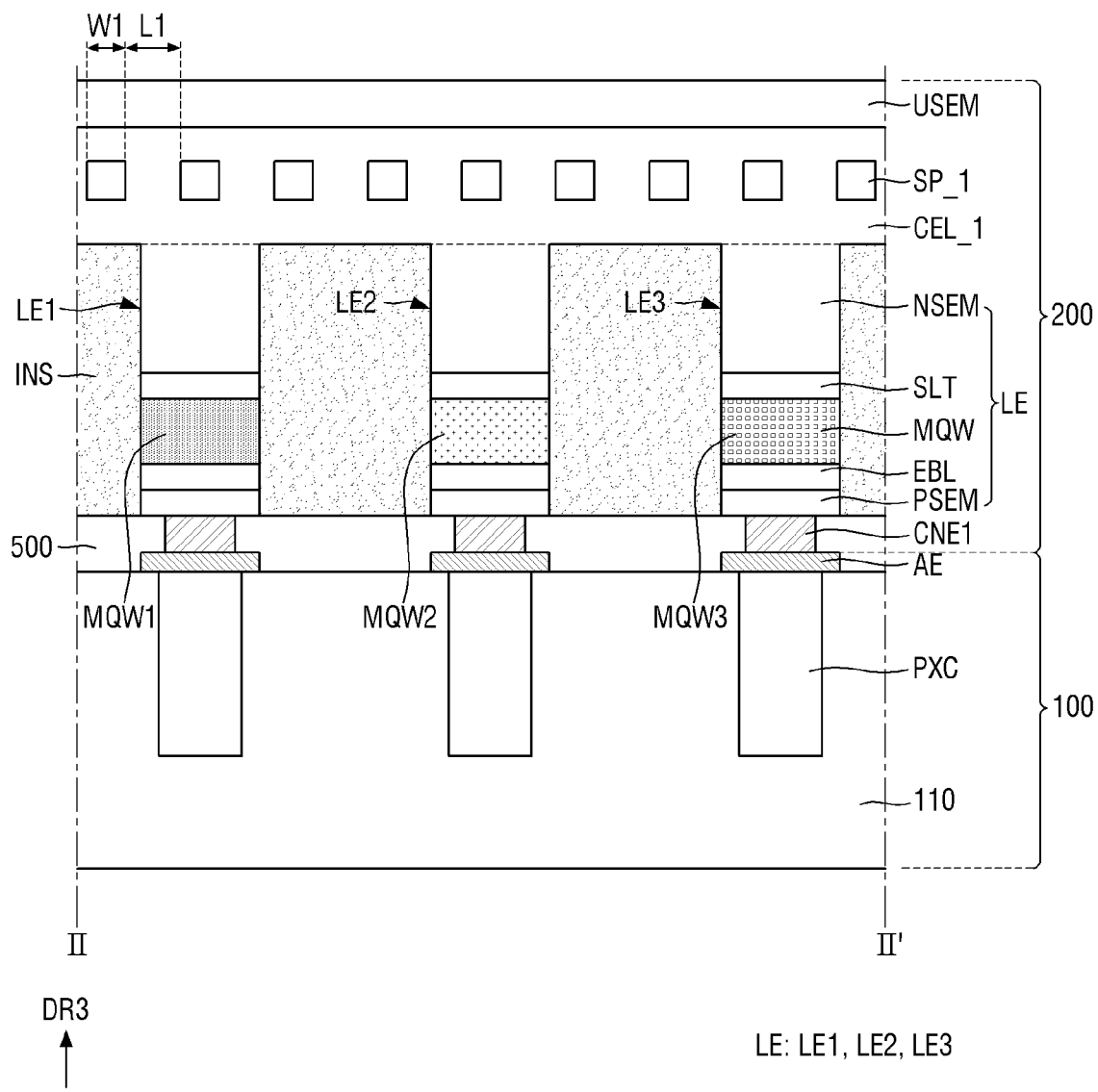
FIG. 18 is a schematic cross-sectional view of a display device according to an embodiment.

FIG. 18 is a schematic cross-sectional view of a display device according to an embodiment.

A display device according to an embodiment of FIG. 18 may be different from the display device of FIG. 6 in that nanostructures SP_1 include voids unlike the nanostructures SP. By way of example, a second common electrode layer CEL2 (see FIG. 21) of a common electrode layer CEL_1 between adjacent nanostructures SP_1 may be in direct contact with the first common electrode layer CEL1_1. The second common electrode layer CEL2 between the light-emitting elements LE1, LE2 and LE3 and the nanostructures SP_1 may be spaced apart from the first common electrode layer CEL1_1 with the nanostructures SP_1 therebetween.

Figure 19:
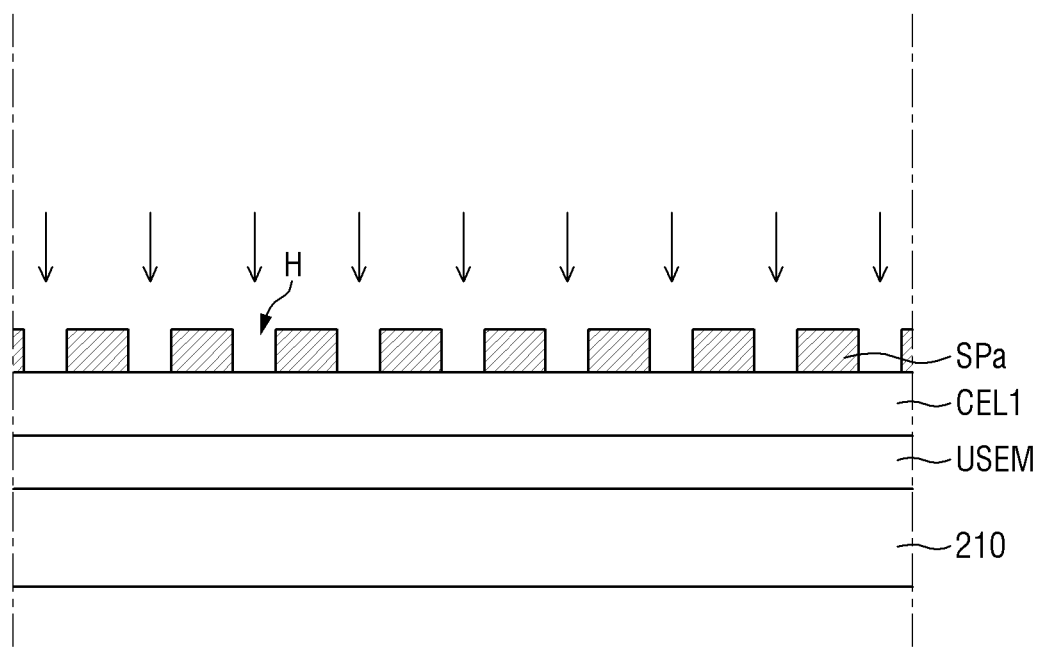
FIGS. 19 to 21 are schematic cross-sectional views showing processing steps of a method of fabricating a display device according to an embodiment.
Figure 20:
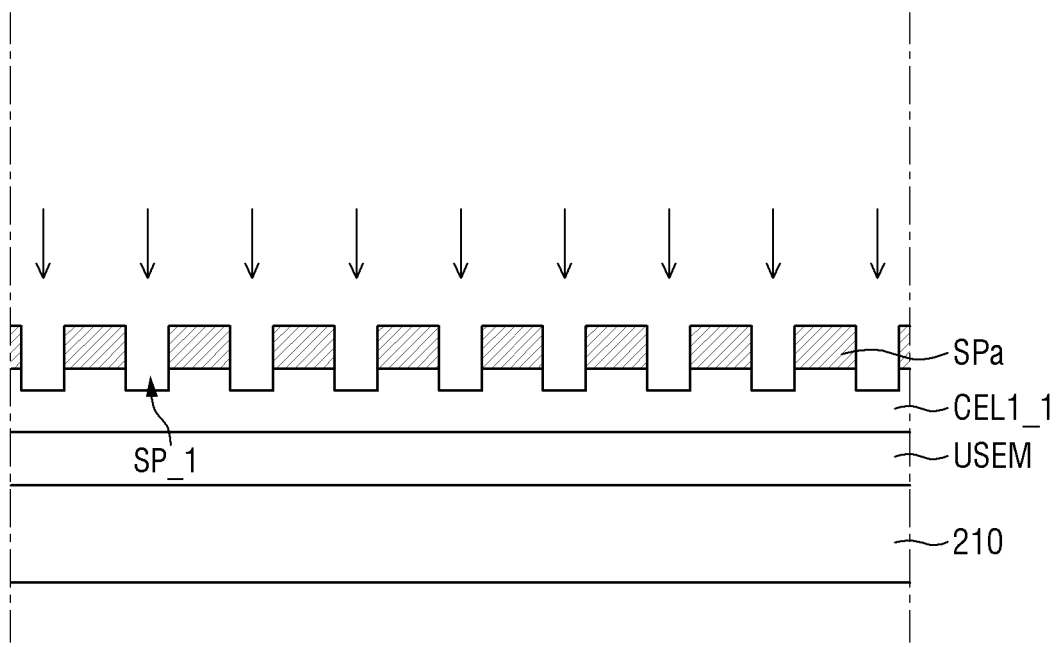
Figure 21:
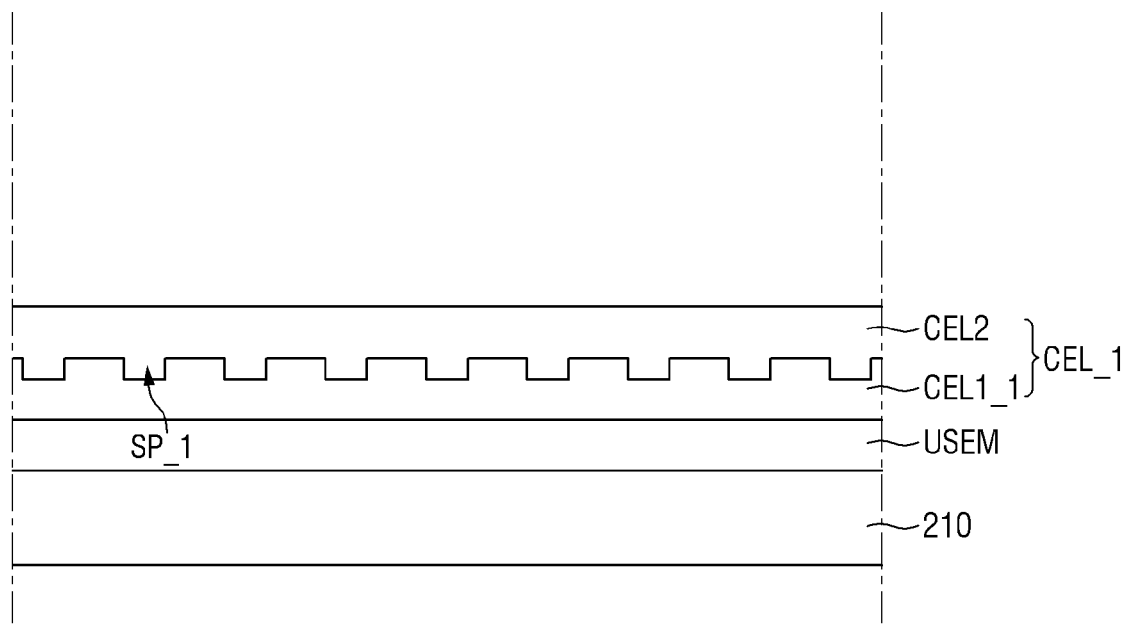

FIGS. 19 to 21 are schematic cross-sectional views showing processing steps of a method of fabricating a display device according to an embodiment.

Referring to FIGS. 18 and 19, in the method of fabricating a display device according to an embodiment, etching the hard mask HM1 (see FIG. 9) to form nanostructures SP_1 spaced apart from each other may include etching the first hard mask HM1 to form mask patterns SPa. The etching area of the first hard mask HM1 may be identical to the space H of the mask patterns SPa.

Subsequently, referring to FIGS. 18 and 20, voids SP_1 recessed from the surface of the first common electrode layer CELL are formed in the first common electrode layer CELL using the mask patterns SPa.

Subsequently, referring to FIGS. 18 and 21, the second common electrode layer CEL2 is re-grown from the first common electrode layer CEL1_1.

Also in this embodiment, the lattice constant of the second common electrode layer CEL2 may be greater than the lattice constant of the first common electrode layer CEL1_1. The lattice constant of the second common electrode layer CEL2 is greater than the lattice constant of the first common electrode layer CEL1_1 because the second common electrode layer CEL2 is re-grown from the first common electrode layer CEL1_1 in the space between the nanostructures SP_1 after the first common electrode layer CEL1_1 has been formed. The lattice constant of the re-grown second common electrode layer CEL2 in the space between the adjacent nanostructures SP_1 increases due to the adjacent nanostructures SP_1. As a result, strain stress inside the re-grown second common electrode layer CEL2 can be greatly reduced.

As a result, in case that the active layers MQW1, MQW2 and MQW3 of the light-emitting elements MQW1, MQW2 and MQW3 are grown on the second common electrode layer CEL2 where the strain stress is significantly reduced, the internal defect of the active layers MQW1, MQW2 and MQW3 can be greatly reduced. Accordingly, it is possible to prevent a decrease in the emission efficiency in case that the light-emitting elements LE1, LE2 and LE3 are driven.

Figure 22:
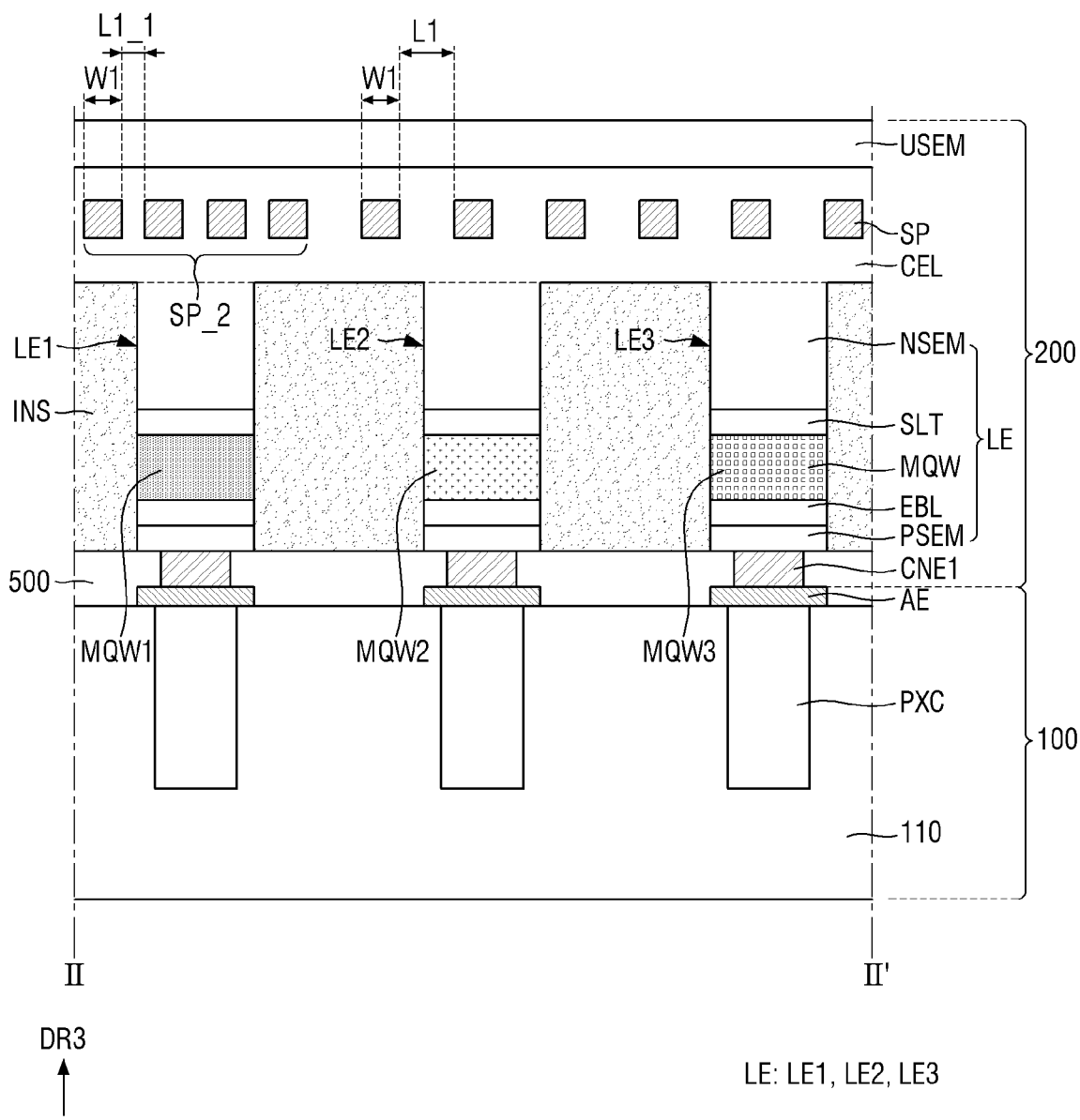
FIG. 22 is a schematic cross-sectional view of a display device according to an embodiment.

FIG. 22 is a schematic cross-sectional view of a display device according to an embodiment.

A display device according to an embodiment of FIG. 22 may be different from the display device of FIG. 6 in that the arrangement density of the nanostructures SP_2 on the first light-emitting elements LE1 of the display device is greater than the arrangement density of the nanostructures SP on the second light-emitting elements LE2 and the arrangement density of the nanostructures SP on the third light-emitting elements LE3.

By way of example, a distance L1_1 between the nanostructures SP_2 on the first light-emitting elements may be smaller than the distance L1 between the nanostructures SP on the second light-emitting elements LE2, and the distance L1 between the nanostructures SP on the third light-emitting elements LE3.

Internal defects may be highly likely to occur in the first active layer MQW1 as described above. Therefore, the arrangement density of the nanostructures SP_2 on the first light-emitting elements LE1 is greater than the arrangement density of the nanostructures SP on the second light-emitting elements LE2 and the arrangement density of the nanostructures SP on the third light-emitting elements LE3 according to this embodiment, so that it is possible to greatly reduce the possibility that internal defects occur in case that the first active layer MQW1 is grown.

Figure 23:
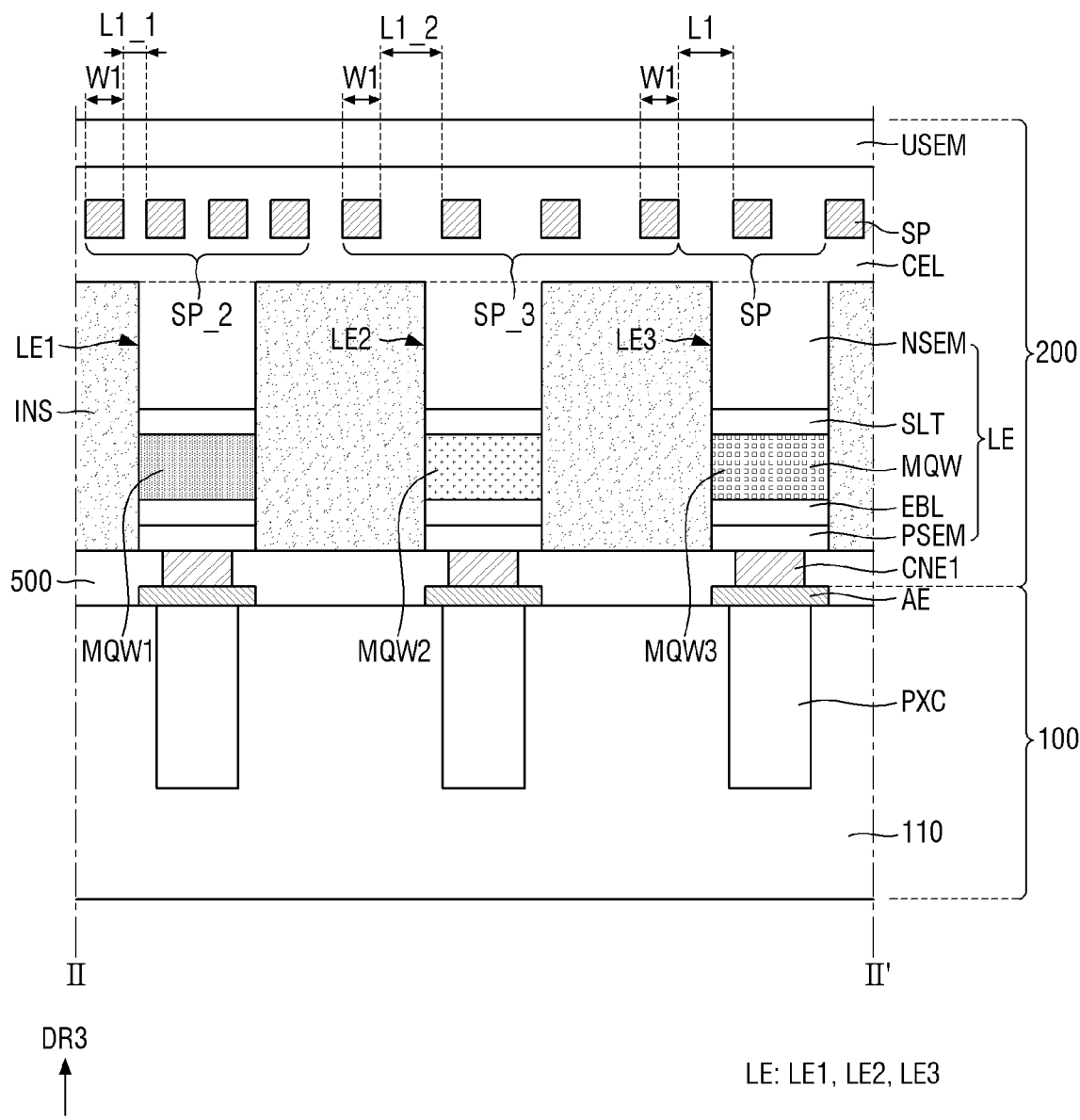
FIG. 23 is a schematic cross-sectional view of a display device according to an embodiment.

FIG. 23 is a schematic cross-sectional view of a display device according to an embodiment.

A display device according to an embodiment of FIG. 23 may be different from the display device of FIG. 22 in that the arrangement density of the nanostructures SP_3 on the second light-emitting elements LE2 of the display device is greater than the arrangement density of the nanostructures SP_2 on the first light-emitting elements LE1 and the arrangement density of the nanostructures SP on the third light-emitting elements LE3.

By way of example, a distance L1_2 between the nanostructures SP_3 on the second light-emitting elements LE2 may be larger than the distance L1_1 between the nanostructures SP_2 on the first light-emitting elements LE1, and may smaller than the distance L1 between the nanostructures SP on the third light-emitting elements LE3.

As described above, the lattice constant of the first active layer MQW1 is the largest, the lattice constant of the second active layer MQW2 is the second largest, and the lattice constant of the third active layer MQW3 is the smallest. According to this embodiment, the arrangement density of the nanostructures SP_3 on the second light-emitting elements LE2 is smaller than the arrangement density of the nanostructures SP_2 on the first light-emitting elements LE1 and is larger than the arrangement density of the nanostructures SP on the third light-emitting elements LE3, so that it is possible to greatly reduce the possibility that internal defects occur in case that the second active layer MQW2 is grown.

Figure 24:
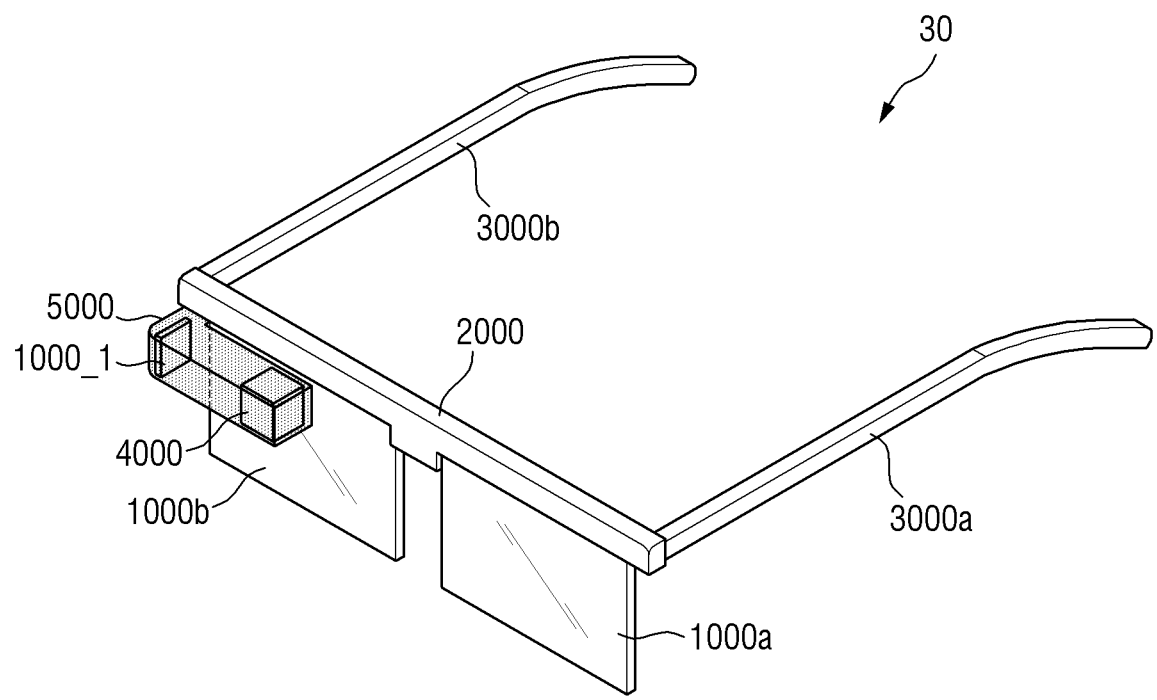
FIG. 24 is a view showing an example of a virtual reality device including a display device according to an embodiment.

FIG. 24 is a view showing an example of a virtual reality device including a display device according to an embodiment. FIG. 24 shows a virtual reality device 30 employing a display device 1000_1 according to an embodiment.

Referring to FIG. 24, the virtual reality device 30 according to the embodiment may be a device in the form of glasses. The virtual reality device 30 according to an embodiment may include the display device 1000_1, a left eye lens 1000a, a right eye lens 1000b, a support frame 2000, eyeglass temples 3000a and 3000b, a reflective member 4000, and a display case 5000.

Although FIG. 24 shows the virtual reality device 30 including the eyeglass temples 3000a and 3000b, a head mounted display with a head strap may be employed as the virtual reality device 30 according to an embodiment instead of the eyeglass temples 3000a and 3000b. For example, the virtual reality device 30 is not limited to that shown in FIG. 24 but may be applied in a variety of electronic devices in a variety of forms.

The display case 5000 may include the display device 1000_1 and the reflective member 4000. An image displayed on the display device 1000_1 may be reflected by the reflective member 4000 and provided to the user's right eye through the right eye lens 1000b. Accordingly, the user may watch a virtual reality image displayed on the display device 1000_1 through the right eye.

Although the display case 5000 is disposed at the right end of the support frame 2000 in the example shown in FIG. 24, the example embodiments are not limited thereto. For example, the display case 5000 may be disposed at the left end of the support frame 2000. An image displayed on the display device 1000_1 is reflected by the reflective member 4000 and provided to the user's left eye through the left eye lens 1000a. Accordingly, the user may watch a virtual reality image displayed on the display device 1000_1 through the left eye. By way of example, the display cases 5000 may be disposed at both the left and right ends of the support frame 2000, respectively. The user can watch a virtual reality image displayed on the display device 1000_1 through both the left and right eyes.

Figure 25:
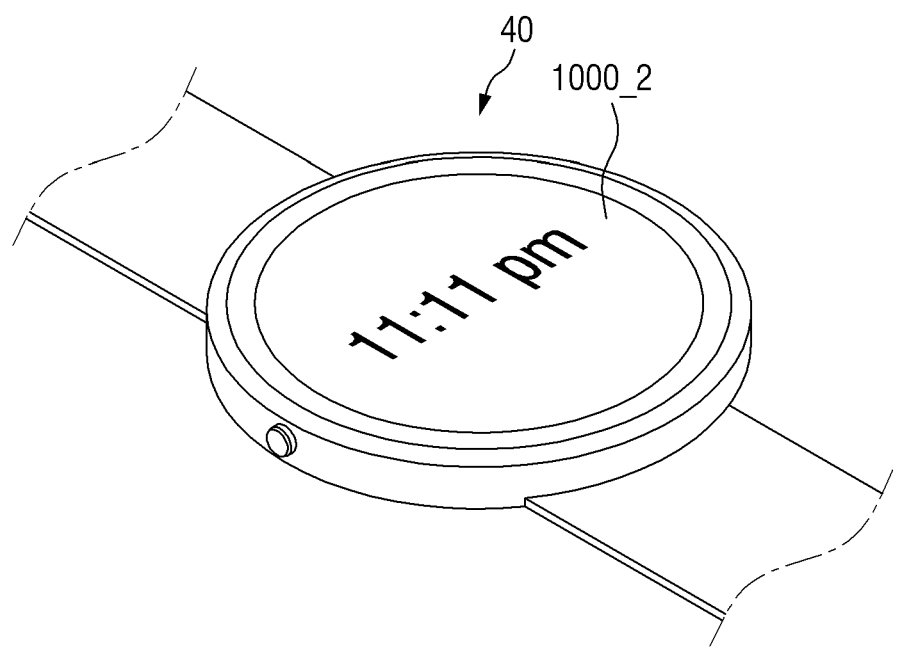
FIG. 25 is a view showing an example of a smart device including a display device according to an embodiment.

FIG. 25 is a view showing an example of a smart device including a display device according to an embodiment.

Referring to FIG. 25, a display device 1000_2 according to an embodiment may be applied to a smart watch 40 that is one of smart devices.

Figure 26:
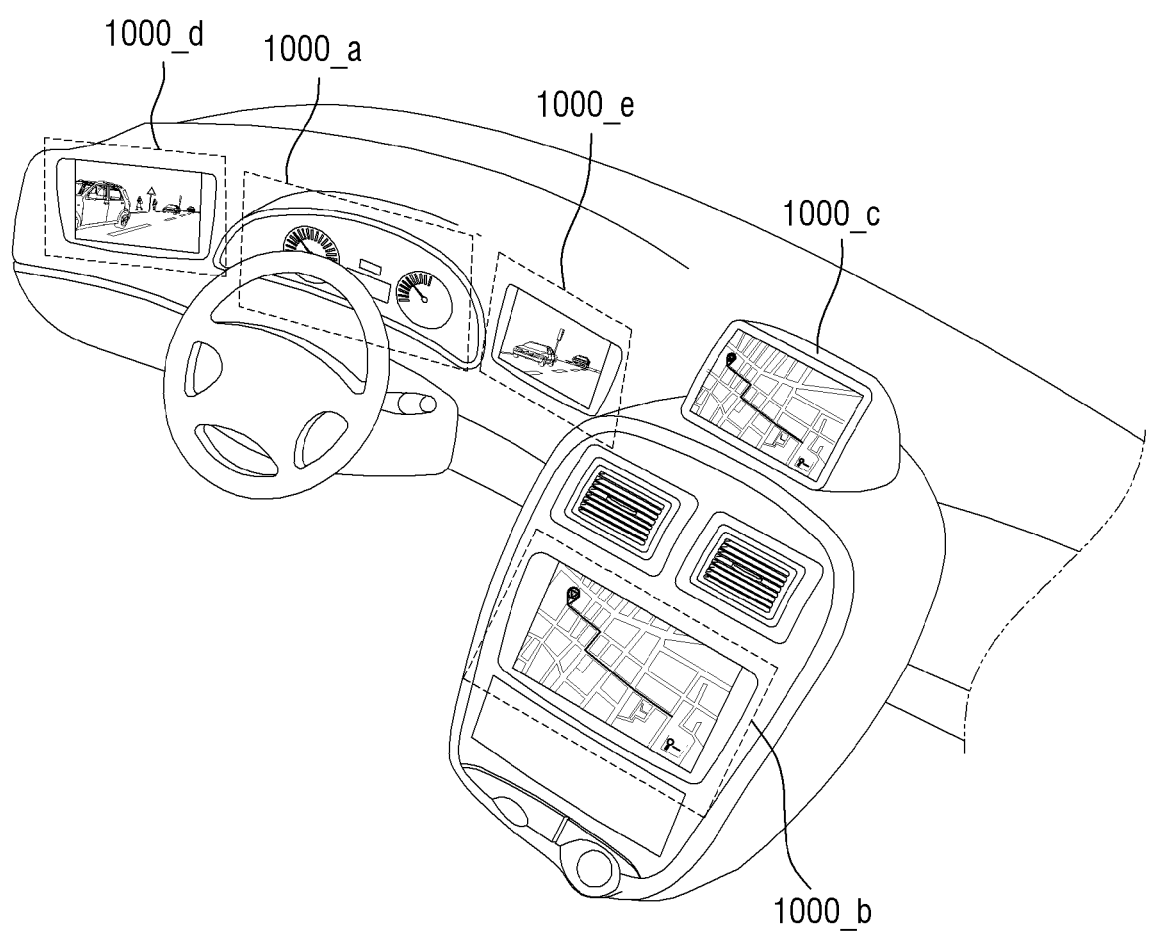
FIG. 26 is a view showing an example of an instrument cluster and a center fascia including display devices according to an embodiment.

FIG. 26 is a view showing an example of an instrument cluster and a center fascia including display devices according to an embodiment. FIG. 29 shows a vehicle in which display devices 1000_a, 1000_b, 1000_c, 1000_d and 1000_e according to an embodiment are applied.

Referring to FIG. 26, the display devices 1000_a, 1000_b and 1000_c according to an embodiment may be applied to the instrument cluster of a vehicle, may be applied to the center fascia of the vehicle, or may be applied to a center information display (CID) disposed on the dashboard of the vehicle. The display devices 1000_d and 1000_e according to an embodiment may be applied to room mirror displays, which can replace side mirrors of the vehicle.

Figure 27:
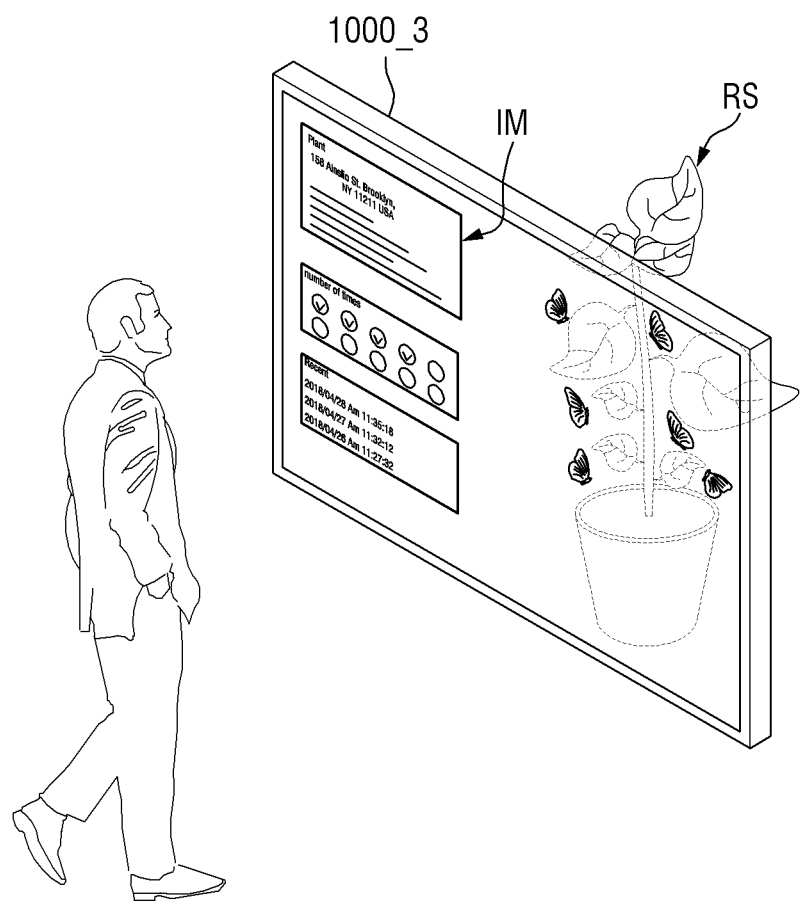
FIG. 27 is a view showing an example of a transparent display device including a transparent display device according to an embodiment.

FIG. 27 is a view showing an example of a transparent display device including a transparent display device according to an embodiment.

Referring to FIG. 27, a display device 1000_3 according to an embodiment may be applied to a transparent display device. The transparent display device may transmit light while displaying images IM. Therefore, a user located on the front side of the transparent display device can not only view the images IM displayed on the display device 1000_3 but also view an object RS or the background located or disposed on the rear side of the transparent display device. In case that the display device 1000_3 is applied to the transparent display device, a first substrate 110 (see FIG. 5) of the display device 1000_3 may include a light-transmitting portion that can transmit light or may be made of a material that can transmit light.

Although embodiments have been disclosed for illustrative purposes, those skilled in the art will appreciate that various modifications, additions and substitutions are possible, without departing from the scope and spirit of the disclosure as disclosed in the accompanying claims.

What is claimed is:

1. A display device comprising:
   pixel electrodes spaced apart from one another on a substrate;
   light-emitting elements disposed on the pixel electrodes;
   a common electrode layer disposed on the light-emitting elements; and
   an undoped semiconductor layer disposed on the common electrode layer, wherein the display device comprises nanostructures disposed in the common electrode layer and spaced apart from one another, and
   the common electrode layer comprises a first common electrode layer disposed between the undoped semiconductor layer and the nanostructures, and a second common electrode layer disposed between adjacent nanostructures and disposed between the light-emitting elements and the nanostructures.

2. The display device of claim 1, wherein
   each of the light-emitting elements comprises a first semiconductor layer electrically connected to the pixel electrode, a second semiconductor layer electrically connected to the common electrode layer, and an active layer disposed between the first semiconductor layer and the second semiconductor layer.

3. The display device of claim 2, wherein
   the second semiconductor layer and the common electrode layer are integral with each other.

4. The display device of claim 2, wherein
   each of the light-emitting elements comprises an electron blocking layer disposed between the first semiconductor layer and the active layer, and a superlattice layer disposed between the active layer and the second semiconductor layer.

5. The display device of claim 4, further comprising:
   connection electrodes disposed between the first semiconductor layer of the light-emitting elements and the pixel electrodes.

6. The device of claim 4, wherein
   each of the second semiconductor layer and the common electrode layer comprises doped n-type gallium nitride (n-GaN).

7. The display device of claim 1, wherein
   the nanostructures comprise an inorganic insulating material.

8. The display device of claim 7, wherein
   the inorganic insulating material comprises silicon oxide ($SiO_x$) or silicon nitride ($SiN_x$).

9. The display device of claim 8, wherein
   the second common electrode layer disposed between the adjacent nanostructures directly contacts the first common electrode layer.

10. The display device of claim 1, wherein
the nanostructures include voids.

11. The display device of claim 10, wherein
the second common electrode layer disposed between the adjacent nanostructures directly contacts the first common electrode layer.

12. The display device of claim 11, wherein
the second common electrode layer disposed between the light-emitting elements and the adjacent nanostructures is spaced apart from the first common electrode layer with the nanostructures disposed between the second common electrode layer and the first common electrode layer.

13. The display device of claim 1, wherein
the light-emitting elements comprises a first light-emitting element, a second light-emitting element, and a third light-emitting element, and
the first light-emitting element comprises a red light-emitting element, the second light-emitting element comprises a green light-emitting element, and the third light-emitting element comprises a blue light-emitting element.

14. The display device of claim 13, wherein
an arrangement density of the nanostructures on the first light-emitting element is greater than an arrangement density of the nanostructures on the second light-emitting element and an arrangement density of the nanostructures on the third light-emitting element.

15. The display device of claim 14, wherein
the arrangement density of the nanostructures on the second light-emitting element is greater than the arrangement density of the nanostructures on the third light-emitting element.

* * * * *